(12) United States Patent
Duffy et al.

(10) Patent No.: US 10,964,104 B2
(45) Date of Patent: Mar. 30, 2021

(54) REMOTE MONITORING AND ASSISTANCE TECHNIQUES WITH VOLUMETRIC THREE-DIMENSIONAL IMAGING

(71) Applicant: Rockwell Automation Technologies, Inc., Mayfield Heights, OH (US)

(72) Inventors: Timothy T. Duffy, Franklin, WI (US); Paul D. Schmirler, Glendale, WI (US); Thong T. Nguyen, New Berlin, WI (US)

(73) Assignee: Rockwell Automation Technologies, Inc., Mayfield Heights, OH (US)

( * ) Notice: Subject to any disclaimer, the term of this patent is extended or adjusted under 35 U.S.C. 154(b) by 0 days.

(21) Appl. No.: 16/287,828

(22) Filed: Feb. 27, 2019

(65) Prior Publication Data

US 2020/0273243 A1    Aug. 27, 2020

(51) Int. Cl.
| | | |
|---|---|---|
| *G06T 17/10* | (2006.01) | |
| *G06T 7/80* | (2017.01) | |
| *G06K 9/00* | (2006.01) | |
| *G06F 30/23* | (2020.01) | |

(52) U.S. Cl.
CPC .............. *G06T 17/10* (2013.01); *G06F 30/23* (2020.01); *G06K 9/00355* (2013.01); *G06T 7/80* (2017.01)

(58) Field of Classification Search
CPC ............ G06T 17/10; G06T 7/80; G06F 30/23
See application file for complete search history.

(56) References Cited

U.S. PATENT DOCUMENTS

| | | | | |
|---|---|---|---|---|
| 6,992,695 B1* | 1/2006 | Simpson | ................ | H04B 3/548 |
| | | | | 348/143 |
| 2013/0050069 A1* | 2/2013 | Ota | ......................... | G06F 3/011 |
| | | | | 345/156 |
| 2014/0300737 A1* | 10/2014 | Lust | ......................... | B64G 1/66 |
| | | | | 348/144 |
| 2015/0381944 A1* | 12/2015 | Renkis | .................... | H04L 67/10 |
| | | | | 348/48 |
| 2016/0124424 A1* | 5/2016 | Strong | ............. | G05B 19/41805 |
| | | | | 700/98 |
| 2016/0246899 A1* | 8/2016 | Hirschtick | ............... | G06F 30/17 |
| 2018/0308024 A1* | 10/2018 | Kilner | ............... | H04N 21/47217 |
| 2020/0120308 A1* | 4/2020 | McMillan | .......... | G06K 7/10386 |

* cited by examiner

*Primary Examiner* — Sarah Lhymn
(74) *Attorney, Agent, or Firm* — Fletcher Yoder P.C.

(57) ABSTRACT

A system for monitoring an industrial system may have a computing device that generates a first three-dimensional (3D) visualization based on 3D video associated with an industrial system. The first 3D visualization may have one or more 3D device visualizations of industrial automation devices, and each 3D device visualization of the industrial automation devices that may depict a 3D object that corresponds to an industrial automation device in the industrial system. The computing device may display the first 3D visualization via an electronic display and detect a gesture in a first set of image data comprising the surrounding of the user and the first 3D visualization. The gesture is indicative of a modification associated with the first 3D visualization. The computing device may receive additional 3D video associated with the industrial system, generate a second 3D visualization based on the modification and the additional 3D video, and display the second 3D visualization via the electronic display.

15 Claims, 11 Drawing Sheets

REMOTE MONITORING AND ASSISTANCE TECHNIQUES WITH VOLUMETRIC THREE-DIMENSIONAL IMAGING

BACKGROUND

The disclosure relates generally to the monitoring and providing technical assistance for industrial systems. More particularly, embodiments of the present disclosure are related to systems and methods for generating and manipulating or modifying visualizations associated with industrial systems for use by a remote user.

An enterprise may be responsible for managing and servicing a plurality of industrial systems distributed around the world, geographically remote from one another. The enterprise may be the owner and operator of the industrial systems, a vendor of the industrial systems, or the enterprise may be contracted by the owner and/or operator of the industrial systems to provide service, support and/or maintenance for the industrial systems. Accordingly, the enterprise may be tasked with how to effectively and efficiently provide service to a plurality of locations distributed across a large geographical area. For example, when an industrial system experiences a problem, the system may be shut down until the problem is resolved. Thus, the enterprise would like to fix the problem as quickly as possible to minimize down time and get the industrial system back up and running. To achieve this, the enterprise may expend significant time and resources hiring and training a large service team to provide prompt and effective service to the geographical area. Alternatively, or additionally, the enterprise may expend significant resources to send one or more members of a service team from a centralized location on short notice and at significant expense to the industrial system to troubleshoot and/or perform repairs to the industrial system. Accordingly, it would be desirable to develop ways to reduce the amount of resources expended to provide prompt service to industrial systems distributed over a large geographical area without a corresponding reduction in the effectiveness of the services provided.

This section is intended to introduce the reader to various aspects of art that may be related to various aspects of the present techniques, which are described and/or claimed below. This discussion is believed to be helpful in providing the reader with background information to facilitate a better understanding of the various aspects of the present disclosure. Accordingly, it should be understood that these statements are to be read in this light, and not as admissions of prior art.

BRIEF DESCRIPTION

A summary of certain embodiments disclosed herein is set forth below. It should be understood that these aspects are presented merely to provide the reader with a brief summary of these certain embodiments and that these aspects are not intended to limit the scope of this disclosure. Indeed, this disclosure may encompass a variety of aspects that may not be set forth below.

In one embodiment, a system for monitoring an industrial system may have a computing device that generates a first three-dimensional (3D) visualization based on 3D video associated with an industrial system. The first 3D visualization may have one or more 3D device visualizations of industrial automation devices, and each 3D device visualization of the industrial automation devices that may depict a 3D object that corresponds to an industrial automation device in the industrial system. The computing device may display the first 3D visualization via an electronic display and detect a gesture in a first set of image data comprising the surrounding of the user and the first 3D visualization. The gesture is indicative of a modification associated with the first 3D visualization. The computing device may receive additional 3D video associated with the industrial system, generate a second 3D visualization based on the modification and the additional 3D video, and display the second 3D visualization via the electronic display.

In another embodiment, a method may include receiving, via one or more processors, data representing a three-dimensional (3D) video associated with an industrial system and generating, via the processors, a first 3D visualization based on the data. The first 3D visualization may have one or more 3D device visualizations and each 3D device visualizations may depict a 3D object that corresponds to a physical industrial automation device in the industrial system. The method may include displaying, via the processors, the first 3D visualization via an electronic display and detecting, via the processors, a gesture in a first set of image data that includes the surrounding of the user and the first 3D visualization. The gesture may be indicative of a modification associated with the first 3D visualization. The method may include sending, via the processors, a command to one or more cameras disposed in the industrial system to position the cameras at a desired position, a desired orientation, or both, to acquire a second set of image data associated with the industrial system in response to detecting the gesture, receiving, via the processors, additional data representing additional 3D video generated based on the second set of image data from the cameras, generating, via the processors, a second 3D visualization based on the modification and the additional data representing the additional 3D video, and displaying, via the processors, the second 3D visualization via the electronic display.

In yet another embodiment, a computer-readable medium may include computer-executable instructions that, when executed, may cause one or more processors to generate a first three-dimensional (3D) visualization based on 3D video associated with an industrial system. The first 3D visualization may include one or more 3D device visualizations and each 3D device visualizations may depict a 3D object that corresponds to a physical industrial automation device in the industrial system. The computer-readable medium may include computer-executable instructions that, when executed, may cause the processors to display the first 3D visualization via an electronic display, track a movement of the user with respect to the first 3D visualization, receive additional 3D video associated with the industrial system based on the movement, generate a second 3D visualization based on the additional 3D video, and display the second 3D visualization via the electronic display. The second 3D visualization may include an animation that corresponds to the movement of the user.

DRAWINGS

These and other features, aspects, and advantages of the present disclosure may become better understood when the following detailed description is read with reference to the accompanying drawings in which like characters represent like parts throughout the drawings, wherein:

FIG. 1 is a block diagram of an exemplary embodiment of a volumetric three-dimensional (3D) imaging system that may be utilized by a remote user to display and interact with a 3D representation of an industrial system, in accordance with an embodiment;

FIG. 2 a block diagram of an exemplary display device of the volumetric 3D imaging system of FIG. 1, in accordance with an embodiment;

Figure 2:
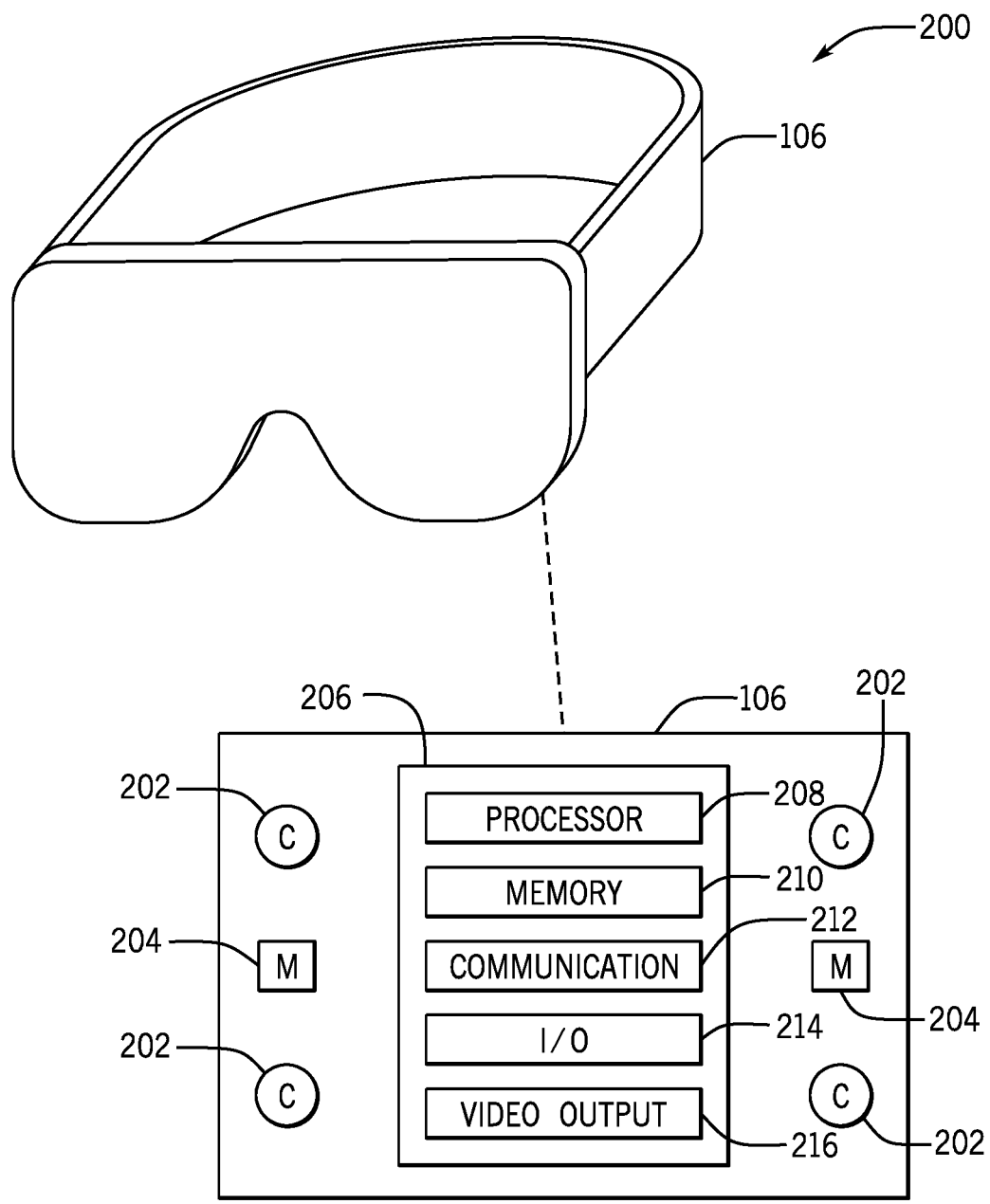
Figure 9:
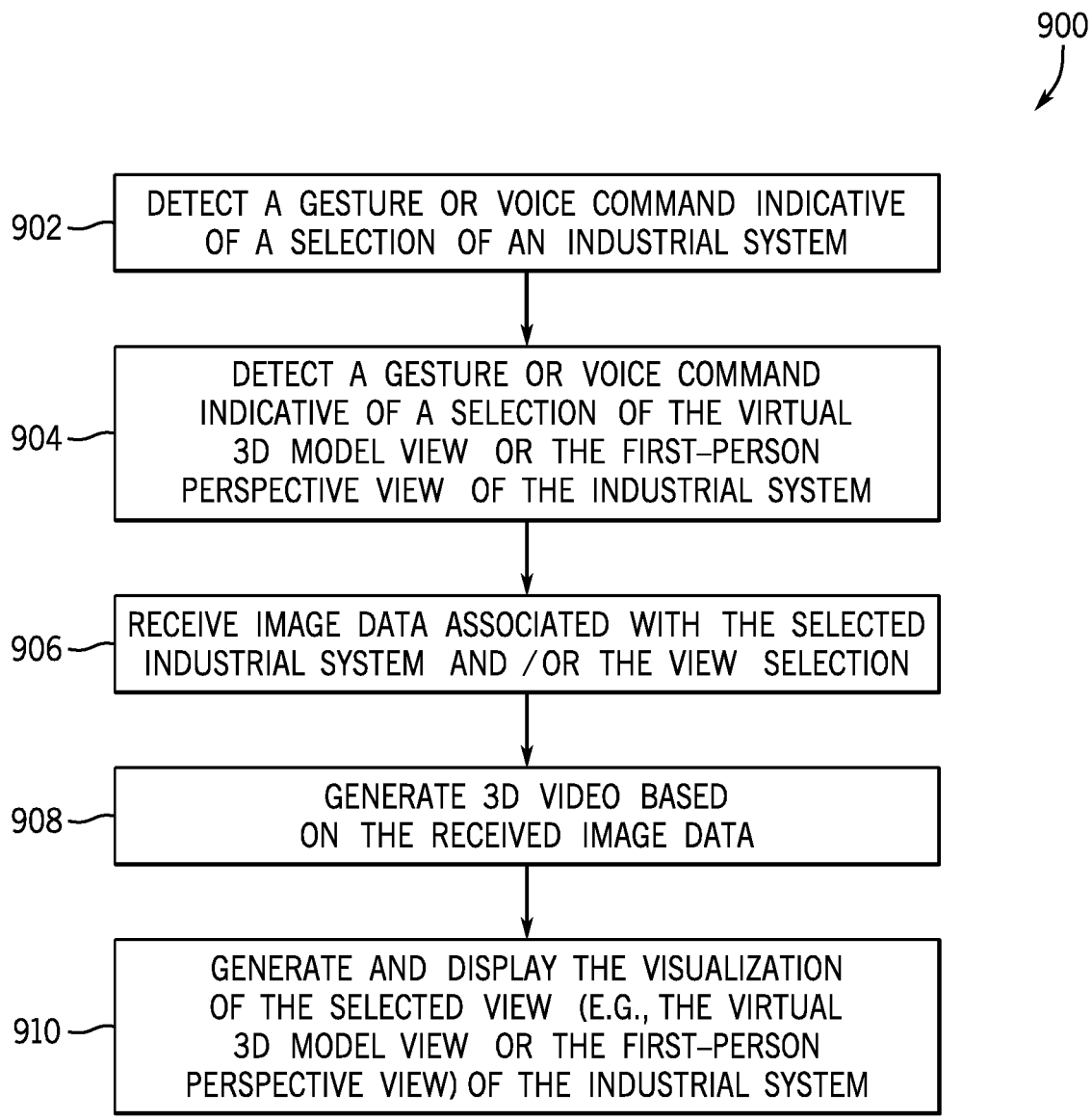
FIG. 9 is a flowchart of a method for displaying a 3D visualization of the industrial system based on one or more gesture or voice commands indicative of a selection to view the industrial system as a 3D representation or from a first-person perspective using the display device of FIG. 2, in accordance with an embodiment.
Figure 10:
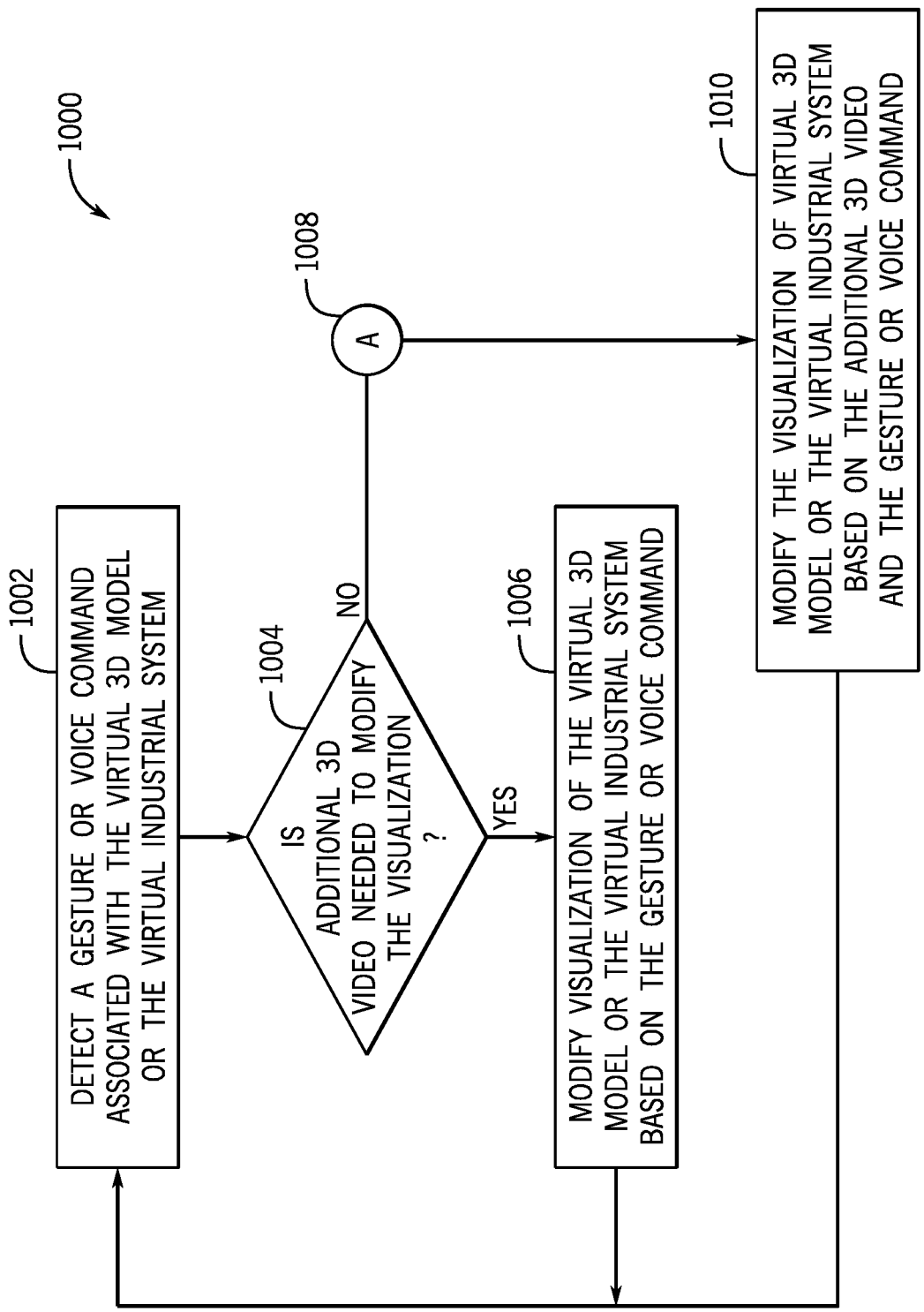
Figure 11:
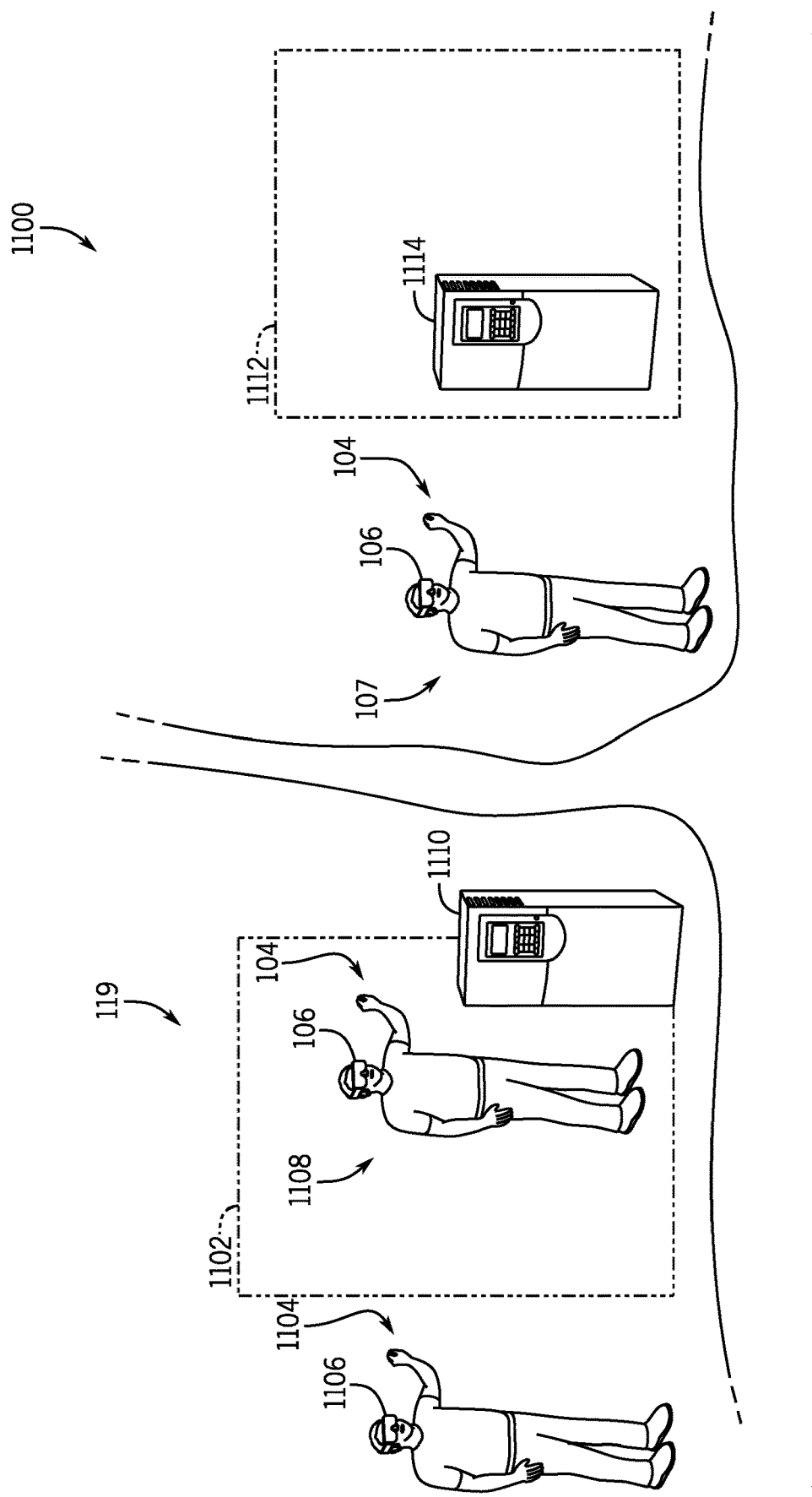

FIG. 10 is a flowchart of a method for modifying the 3D visualization of FIG. 9 based on one or more gesture or voice commands indicative of the remote user's interaction with or navigation through the 3D visualization using the display device of FIG. 2, in accordance with an embodiment; and FIG. 11 is a perspective view of an exemplary 3D visualization that may be perceived by a local user within the industrial system utilizing the display device of FIG. 2 to communicate with the remote user utilizing the display device of FIG. 2, in accordance with an embodiment.

DETAILED DESCRIPTION

One or more specific embodiments of the present disclosure will be described below. In an effort to provide a concise description of these embodiments, all features of an actual implementation may not be described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

When introducing elements of various embodiments of the present disclosure, the articles "a," "an," "the," and "said" are intended to mean that there are one or more of the elements. The terms "comprising," "including," and "having" are intended to be inclusive and mean that there may be additional elements other than the listed elements. One or more specific embodiments of the present embodiments described herein will be described below. In an effort to provide a concise description of these embodiments, all features of an actual implementation may not be described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

For an industrial system with many components, it may be beneficial to monitor the industrial system and/or provide maintenance to the industrial system remotely. For example, to provide maintenance to a complex industrial automation device within the industrial system, a specialized maintenance technician may travel to the industrial system. Before arriving at the industrial system and physically inspecting the industrial automation device, the maintenance technician may have a general idea of the issue but may not have sufficient information to ascertain the particular issue associated with the industrial automation device. Thus, it may be beneficial to facilitate remote monitoring of the industrial system such that a remote user may view the industrial automation device, the environment of the industrial automation device, the rest of the industrial system, or a combination thereof, in real-time or substantially real-time. In this way, the remote user may diagnose the industrial automation device requiring maintenance without physically visiting the industrial system and, in certain cases, provide maintenance to the industrial automation device remotely. For example, the remote user may provide maintenance instructions to personnel located within the industrial system.

The present disclosure is generally directed towards a volumetric three-dimensional (3D) imaging system that may display one or more visualizations of a real-world, industrial system in a volumetric 3D imaging environment to a remote user and detect various commands (e.g., gesture or voice) performed by the remote user that correspond to respective interactions with real-world and/or computer-generated content in the volumetric 3D imaging environment. As used herein, a remote user refers to a user associated with the volumetric 3D imaging system that is not physically located within the industrial system. Additionally, although the volumetric 3D imaging system is described herein as providing a volumetric 3D imaging experience to the remote user, it should be noted that features of the volumetric 3D imaging system may be utilized within an augmented reality context, a virtual reality context, a mixed reality context, or the like. For example, the visualizations of the real-world, industrial system may be displayed in an augmented reality environment, a virtual reality environment, a mixed reality environment, or any other suitable technological environment.

The volumetric 3D imaging system may display a visualization of the industrial system in the volumetric 3D imaging environment to the remote user such that the visualization includes real-time or near-real-time (e.g., updated within seconds) image data associated with the industrial system. For example, the real-time or near-real-time image data may include 2D image data, 2D video data, 3D image data, 3D video data, or a combination thereof. The volumetric 3D imaging system may receive 3D video (e.g., volumetric video) associated with the industrial system and generate the visualization based on the received 3D video. For example, an imaging system associated with the industrial system may acquire image data of an industrial automation device, the environment of the industrial automation device, other regions of the industrial system, or a combination thereof. The acquired image data may include 2D image data, 2D video data, 3D image data, 3D video data, or a combination thereof. The imaging system may include one or more cameras positioned within the industrial system. For example, the cameras may include one or more mobile cameras mounted to an overhead track, one or more drone devices, or other suitable devices for acquiring image data associated with the industrial automation device, the environment of the industrial automation device, or the other regions of the industrial system. A computing system communicatively coupled to the imaging system may receive image data associated with the industrial automation device, the environment of the industrial automation device, other regions of the industrial system, or a combination thereof, from the imaging system in real-time or substantially real-time. After receiving the image data from the imaging system, the computing system may generate 3D video based on the received image data. For example, the computing system may generate a 3D point cloud based on the received image data.

After generating the visualization based on the 3D video, the volumetric 3D imaging system may provide the visualization to the remote user via a display device, such as a head mounted device, a smart phone, a tablet, or other suitable volumetric 3D imaging display devices. In one embodiment, the visualization provided to the remote user may include a 3D representation of the industrial system, or portions thereof, such that the remote user may pick up, view, and interact with the 3D representation. For example, the volumetric 3D imaging system may detect one or more gesture or voice commands performed by the remote user as the remote user views or interacts with the 3D representation. The gesture and/or voice commands may correspond to the display or the modification of the 3D representation associated with the industrial system. For example, the volumetric 3D imaging system may display or modify the 3D representation of the industrial system, the 3D representation of one or more industrial automation devices within the industrial system, the 3D representation of the environment of each industrial automation device, or a combination thereof. The 3D representation of the industrial system, the 3D representation of each industrial automation device, and the 3D representation of the environment of each industrial automation device may appear the same or substantially similar to the remote user as the appearance of the real-world counterparts (e.g., the real-world, industrial system, the real-world, industrial automation device, and the real-world environment). In this way, the volumetric 3D imaging system may provide a visualization of a real-time or a substantially real-time 3D representation of the industrial system to the remote user via the display device.

Although some embodiments of the present disclosure are described herein with reference to stitching together image or video data to generate 3D video that may be integrated into a visualization of a real-time or a substantially real-time 3D representation of the industrial system, it should be understood that sensor data may also be stitched with the 3D video and integrated into the visualization to provide real-time or substantially real-time data of the industrial system, or portions thereof, to the remote user. For example, the computing system may receive audio data, operational data (e.g., temperature data, pressure data, or the like), maintenance data, or any other sensor-generated data, from various sensors in the industrial system. The sensor data may be associated with an industrial automation device, the environment of the industrial automation device, other regions of the industrial system, or a combination thereof, from the sensors in the industrial system in real-time or substantially real-time. In some embodiments, the cameras in the industrial system may also have microphones or other suitable sensors that acquire audio data or other sensor data of the industrial system and send the acquired data to the computing system. After receiving the sensor data from the sensors in the industrial system, the computing system may stitch (e.g., synchronize) the sensor data with the image or video data to generate stitched data that may be integrated into a 3D representation of the industrial system to the remote user via the display device. For example, as the remote user is viewing a particular region of the 3D representation of the industrial system, the remote user may also hear sounds or experience representations of sensor data (e.g., via microphones, via haptic devices, via display devices, or the like) associated with the particular region of the industrial system via the display device or other suitable devices. In this way, the remote user may spatially experience (e.g., the visual data, the audio data, the sensor data, or the like) industrial system in real-time or near-real-time.

Additionally, after detecting a gesture or voice command performed by the remote user, the volumetric 3D imaging system may modify the visualization based on the detected gesture or voice command. For example, the volumetric 3D imaging system may alter the orientation of the 3D representation (e.g., tilt or rotate), zoom into a portion of the 3D representation, zoom out of a portion of the 3D representation, provide data associated with the real-world, industrial system, the real-world, industrial automation devices, the real-world environment of the industrial automation devices, or the like.

In another embodiment, it may be beneficial to virtually position the remote user in the 3D visualization of the industrial system such that the remote user may interact with and navigate through (e.g., walk around or move around) the 3D visualization. In this way, the remote user may acquire a first-person perspective of the 3D visualization of the industrial system similar to the real-world perspective that the remote user would receive when visiting the real-world, industrial system. In some embodiments, the remote user may view and navigate the 3D visualization via the volumetric 3D imaging system without physically walking around or moving around. That is, the volumetric 3D imaging system may detect various gesture and/or voice commands that may cause the volumetric 3D imaging system to modify the 3D visualization based on the particular gesture or voice command detected. For example, the remote user may perform a navigational gesture or voice command (e.g., forward, backward, left, right) that may facilitate movement of the remote user within the visualization associated with the industrial system.

With the foregoing in mind, as the remote user interacts with the 3D representation of the industrial system and/or interacts with or navigates through the 3D visualization, the volumetric 3D imaging system may update or modify the 3D visualization based on the remote user's interactions with the 3D representation and/or the remote user's interactions with or navigation through the 3D visualization. In some embodiments, the volumetric 3D imaging system may determine that additional 3D video of the industrial system is required to display or modify the visualization. For example, the remote user may rotate the 3D representation of the industrial system to a different angle that includes regions of the 3D representation of the industrial system that are not yet rendered with 3D video. In another example, the remote user may navigate through the 3D visualization toward a non-rendered region of the 3D visualization. Upon detecting the remote user's interaction with the 3D representation or the remote user's virtual movement toward the non-rendered region, the volumetric 3D imaging system may send a request to the imaging system associated with the industrial system to acquire image data of the real-world region of the industrial system that corresponds to the non-rendered region. In some embodiments, the imaging system may determine a desired position and/or orientation associated with each mobile camera to acquire the imaging data based on the request. For example, the request may include identification data associated with a particular industrial automation device or a particular region of the industrial automation system. Based on the request, the imaging system may send a command signal to each mobile camera to adjust the position and/or orientation of each mobile camera to respective desired positions and/or orientations to acquire the requested image data. The imaging system may then send the acquired image data to the computing system to generate 3D video based on the received image data. In this way, the computing system may generate real-time or near-real-time 3D video of the real-world, industrial system as needed based on the remote user's interactions with the 3D representation and/or the remote user's interactions with or navigation through the 3D visualization of the industrial system. The volumetric 3D imaging system may then receive the 3D video from the computing system and modify the 3D visualization displayed to the remote user to render the non-rendered regions of the 3D visualization.

Although the volumetric 3D imaging system is described herein as providing computer-generated content visually, it should be noted that the volumetric 3D imaging system may provide computer-generated content via other types of sensory modalities. For example, the computer-generated content may be presented to a user via an auditory modality, a haptic modality, a somatosensory modality, an olfactory modality, or the like. Additionally, although the volumetric 3D imaging system is described herein as providing a volumetric 3D imaging experience to the user, it should be noted that features of the volumetric 3D imaging system may be utilized within an augmented reality context, a virtual reality context, a mixed reality context, or the like. In one embodiment, the volumetric 3D imaging system may generate and display a visualization that contains real-world content (e.g., the user's surroundings or portions of the user) and/or computer-generated content (e.g., virtual or 3D objects). In another embodiment, the volumetric 3D imaging system may have a transparent display and display a visualization of real-world content, computer-generated content, or both, superimposed over the transparent display to produce virtual or 3D objects within real world surroundings. In any case, the volumetric 3D imaging system may detect certain commands performed by the remote user to interact with or modify the visualization displayed via the volumetric 3D imaging system.

For ease of discussion, the description of the volumetric 3D imaging system provided herein is made with reference to remote monitoring of an industrial system or providing maintenance to the industrial system. However, it should be noted that the volumetric 3D imaging system, as described herein, is not limited to such embodiments. The volumetric 3D imaging system may be used in various other fields and applications. For example, the volumetric 3D imaging system may be used to monitor archaeological sites, residential or commercial buildings, underground structures, or offshore wells, visualize commercial products, such as furniture, clothing, appliances, or vehicles, provide educational material or training, visualize local or remote geographic features, such as cities, forests, or oceans, facilitate social interaction, provide digital game play in a real world environment, provide medical information, such as X-ray, ultrasound, or magnetic resonance imaging (MRI) data, provide quality assurance, or the like.

It should be noted that the gesture commands performed by the remote user, as described herein, to interact with the 3D representation of the industrial system and/or interact with or navigate through the 3D visualization of the industrial system may be more beneficial for the remote user if they mimic real world motions. That is, the gesture commands may be performed in the same manner a person may wish to interact with and/or navigate a real-world environment. In this way, the volumetric 3D imaging system may provide a more desirable interface between the remote user and the volumetric 3D imaging environment. Additionally, it should be noted that the gesture commands and the voice commands described herein are exemplary and non-limiting and that other gesture commands and voice commands may be performed that provide similar interactions with the visualization associated with the industrial system as described herein or similar gesture commands and voice commands may be performed that provide different interactions with the visualization associated with the industrial system as described herein.

Figure 1:
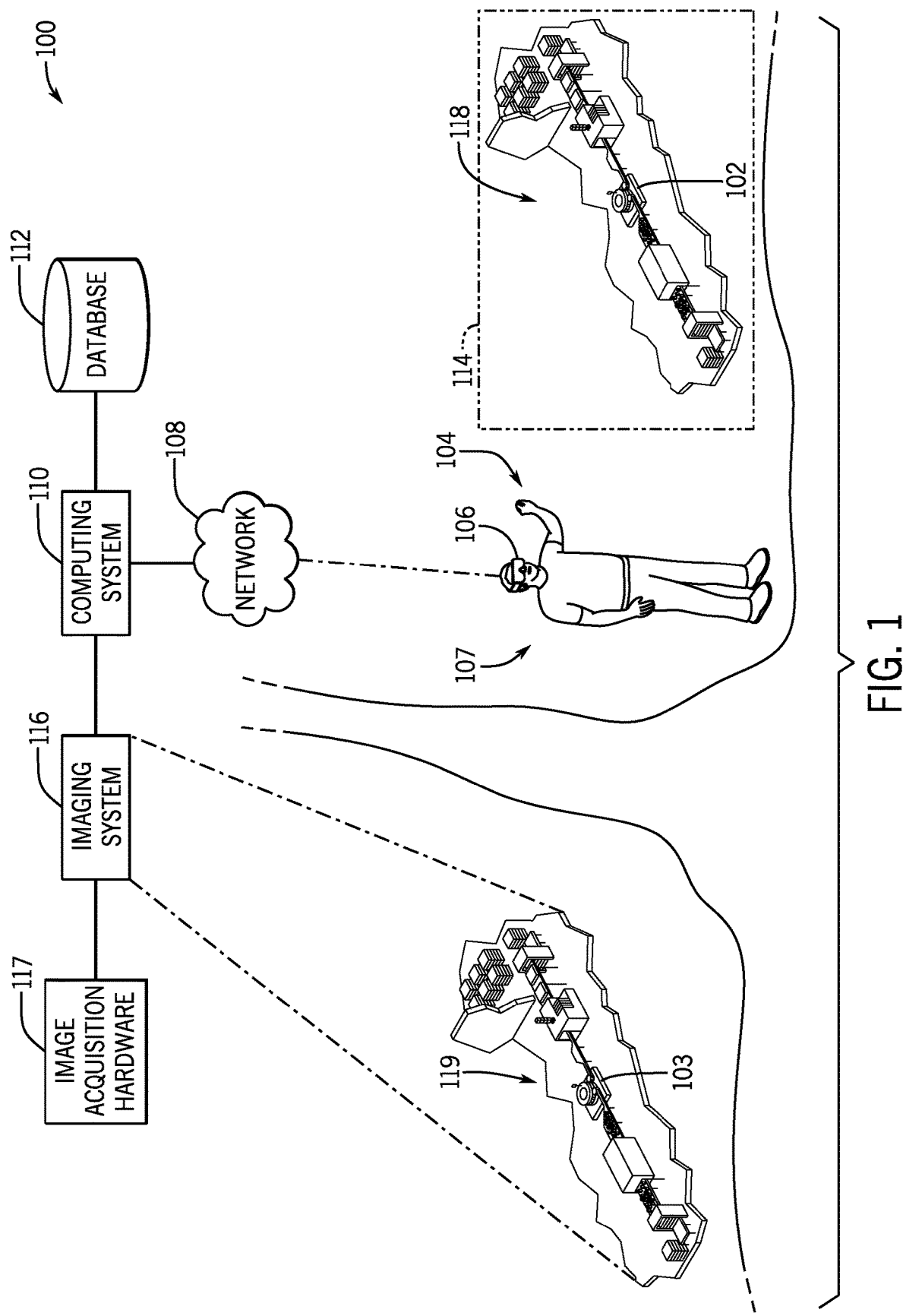

By way of introduction, FIG. 1 is a block diagram of an volumetric 3D imaging system 100 that may be utilized by a remote user 104 to display a visualization 114 that includes a 3D device visualization 102 of a real-world, industrial automation device 103, a 3D visualization of the real-world environment of the real-world industrial automation device, a 3D visualization 118 of a real-world, industrial system 119, or a combination thereof, in an volumetric 3D imaging environment. The remote user 104 may be located in an area 107 geographically remote or different from the location of the real-world, industrial system 119. For example, the remote user 104 may be located in an office building while the industrial system 119 may be located in an industrial facility in a different location (e.g., in another continent, another country, another geographical region, another state, another city, etc.). In some embodiments, the visualization 114 may include one or more 3D device visualizations 102 of the industrial automation devices 103, one or more regions of the 3D visualization 118, or the entire 3D visualization 118 of the industrial system 119.

In the illustrated embodiment, the volumetric 3D environment may refer to the visualization 114 that includes a combination of computer-generated and real-world content displayed to the remote user 104 via a head mounted device 106 of the volumetric 3D imaging system 100. Although the head mounted device 106 is employed within the illustrated embodiment of the volumetric 3D imaging system 100, it should be noted that, in other embodiments, other suitable types of displays may be employed by the volumetric 3D imaging system 100. For example, the volumetric 3D imaging system 100 may employ smart glasses, a virtual retinal display, one or more contact lenses, a computer, a mobile device, or any other suitable electronic display device for displaying visualizations to a user 104. In any case, the head mounted device 106 may display the visualization 114 that includes the 3D device visualization 102 or the 3D visualization 118 of the industrial system to the remote user 104. Additional details with regard to the head mounted device 106 may be discussed below with reference to FIG. 2.

The volumetric 3D imaging system 100 may display the 3D device visualization 102 of the industrial automation device or the 3D visualization 118 of the industrial system in various perspectives to the remote user 104. In the illustrated embodiment, for example, the volumetric 3D imaging system 100 may display the 3D visualization 118 to the remote user 104 as a 3D representation that the remote user 104 may interact with. For example, the remote user 104 may perform various gestures or voice commands indicative of a tilt command, a rotate command, a zoom in command, a zoom out command, a data provision command, or the like. Additional details with regard to the display of the 3D representation of the industrial system and various interactions with the 3D representation may be discussed below with reference to FIGS. 4-6. In another embodiment, the volumetric 3D imaging system 100 may virtually position the remote user in the 3D visualization 118 of the industrial system such that the remote user 104 may acquire a first-person perspective of the 3D visualization 118 and interact with or navigate through (e.g., walk around or move around) the 3D visualization 118. Additional details with regard to the display of the first-person perspective of the 3D visualization 118 and the remote user's interactions with and navigation through the 3D visualization 118 may be discussed below with reference to FIGS. 7 and 8.

In the illustrated embodiment, the 3D visualization 118 includes various industrial automation devices associated with a manufacturing or assembly line. However, it should be noted that the illustrated embodiment is intended to be non-limiting and that the volumetric 3D imaging system 100 may display a 3D representations of other industrial automation devices, or parts thereof, that may be employed within other real-world, industrial systems. For example, the industrial automation devices may include controllers, input/output (I/O) modules, motor control centers, motors, valves, actuators, temperature elements, pressure sensors, human machine interfaces (HMIs), operator interfaces, contactors, starters, sensors, drives, relays, protection devices, switchgear, compressors, network switches (e.g., Ethernet switches, modular-managed, fixed-managed, service-router, industrial, unmanaged, etc.), data centers, conveyor sections, movers, and the like.

As mentioned above, the computing system 110 may receive image data of the real-world, industrial system 119 from an imaging system 116. As illustrated in FIG. 1, the imaging system 116 is communicatively coupled to the computing system 110. The imaging system 116 may include image acquisition hardware or devices 117 (e.g., one or more cameras) positioned within the real-world, industrial system 119. After the imaging system 116 acquires image data associated with the real-world, industrial system 119, the imaging system 116 may send the image data to the computing system 110. The image acquisition hardware or devices 117 may also include infrared cameras or multipurpose cameras that may acquire thermal data or other suitable types of data of industrial automation devices in the industrial system or regions of the industrial system. Additional details with regard to the imaging system 116 may be discussed below with reference to FIG. 3.

The computing system 110 may process the image data (e.g., stitch images together, triangulate features found in multiple images, etc.) to generate 3D video (e.g., volumetric video) based on the image data received from the imaging system 116. For example, the computing system 110 may process the image data received from the imaging system 116 and generate a 3D point cloud based on the image data associated with the real-world, industrial system 119 or one or more real-world, industrial automation devices 103 in the real-world, industrial system 119. The 3D point cloud may be utilized by the volumetric 3D imaging system 100 to generate 3D surfaces of the industrial automation devices 103 or the industrial system 119 associated with the 3D point cloud. In some embodiments, the computing system 110 may store the generated 3D video in a database 112 communicatively coupled to the computing system 110. For example, the 3D video may be indexed by an identifier indicative of an industrial automation device, a region of the industrial system, or the industrial system associated with the 3D video. Additionally, the identifier may include a timestamp indicative of the date and time the 3D video was generated by the computing system 110 or stored in the database 112. The volumetric 3D imaging system 100 may then generate 3D visualization 118 of the industrial system based on the 3D video received from the computing system 110 and display the visualization 114 to the remote user 104 via the head mounted device 106.

Additionally, the computing system 110 may enhance the generated 3D video based on computer-aided-design (CAD) drawings associated with the industrial system 119 or one or more industrial automation devices 103 in the industrial system 119. For example, the 3D video may be utilized by the computing system 110 to generate virtual representations of industrial automation devices, a virtual representation of the industrial system, or portions thereof, that may be manipulated and interacted with by the remote user 104. For example, after a virtual representation of an industrial automation device that incorporates the 3D video is displayed in the visualization 114 to the remote user 104, the remote user 104 may open the virtual representation of the industrial automation device to view and interact with interior components of the virtual representation of the industrial automation device.

As the remote user 104 interacts with or navigates through the 3D visualization 118, the volumetric 3D imaging system 100 may update or modify the 3D visualization 118. After detecting the remote user's interactions with or navigation through the 3D visualization 118, the volumetric 3D imaging system 100 may send a request to the computing system 110 for additional 3D video associated with the real-world, industrial system 119 or one or more real-world industrial automation devices. For example, the head mounted device 106 may detect the remote user's interaction (e.g., via a gesture or voice command) with the 3D visualization 118 to view a desired region of the 3D visualization 118 (e.g., a non-rendered region) that is different than the region of the 3D visualization 118 presently displayed to the remote user 104. The head mounted device 106 may then send a request to the computing system 110 for additional 3D video associated with the desired region of the 3D visualization 118. For example, the request may include identification data associated with a particular industrial automation device or the desired region of the 3D visualization 118. The computing system 110 may then transmit the request to the imaging system 116 to acquire image data associated with the desired region of the real-world industrial system 119. Based on the request, the imaging system may send a command signal to one or more mobile cameras to acquire the requested image data. In some embodiments, the imaging system 116 may send a command signal to the mobile cameras to reposition and/or reorient in the industrial system 103 to acquire the image data associated with the desired region of the real-world industrial system 119. Additional details with regard to configurations of the imaging system may be discussed below with reference to FIG. 3.

The imaging system 116 may then send the acquired image data to the computing system 110. After receiving the image data from the imaging system 116, the computing system 110 may generate 3D video based on the received image data. The volumetric 3D imaging system 100 may then modify the visualization 114 based on the generated 3D video to display the desired region of the 3D visualization 118 to the remote user 104 via the head mounted device 106. In this way, the volumetric 3D imaging system 100 may generate and display real-time or substantially real-time data associated with different regions of the 3D visualization 118 as needed (e.g., when the information is of interest to the remote user 104), thereby reducing the processing load of the computing system 110 and the head mounted device 106 to display the 3D visualization 118.

In certain embodiments, the head mounted device 106 of the volumetric 3D imaging system 100 may detect a gesture command performed by the remote user 104 to manipulate the visualization 114. For example, the volumetric 3D imaging system 100 may detect a gesture command performed by the user 104 to rotate the 3D device visualization 102. The head mounted device 106 may analyze characteristics of image data associated with the user's biomechanical movements to determine if the image data matches a characteristic of a gesture command stored, learned, or otherwise interpretable by the head mounted device 106 of the volumetric 3D imaging system 100. Image data associated with the user's biomechanical movements may include the motion, or lack thereof, of the user's hands, wrists, arms, fingers, or any other suitable body part to distinguish one gesture command from another gesture command. In some embodiments, the head mounted device 106 may acquire the image data and send the image data, via network 108, to a computing system 110 to analyze the characteristics of the image data to determine if the image data matches a characteristic of a gesture command stored, learned, or otherwise interpretable by the computing system 110. It should be noted that any suitable network may be employed in the embodiments described herein. For instance, the network 108 may include any wired or wireless network that may be implemented as a local area network (LAN), a wide area network (WAN), and the like. Indeed, other industrial communication network protocol, such as Ethernet/IP, ControlNet, DeviceNet, and the like, may also be used. In any case, the network 108 may permit the exchange of data in accordance with a protocol.

In some embodiments, the head mounted device 106 may be communicatively coupled to one or more motion sensors attached to the remote user's body. For example, one or more motion sensors may be disposed on the user's hands, wrists, arms, fingers, legs, feet, torso, or any other suitable body part and provide motion data (e.g., body motion capture data) to the head mounted device 106. In one embodiment, based on the received motion data associated with the remote user 104, the head mounted device 106 may analyze the motion data associated with a respective body part of the remote user 104 and determine a gesture command stored, learned, or otherwise interpretable by the head mounted device 106. In another embodiment, the head mounted device 106 may analyze the motion data associated with the respective body part of the remote user 104 and determine a virtual force (e.g., a virtual speed, virtual displacement, or virtual direction) associated with a gesture command performed by the remote user 104. For example, the head mounted device 106 may determine a speed and an angle associated with the movement of the remote user's hand or the user's foot after the remote user 104 performs a rotate gesture command against the 3D visualization 118. The head mounted device 106 may then modify the visualization 114 to display an animation of the rotation of the 3D visualization 118 based on the determined speed and angle associated with the movement of the remote user's hand or foot.

Additionally, as the remote user 104 interacts with or navigates through the 3D visualization 118, the volumetric 3D imaging system 100 may alter the quantity or the type of data (e.g., image data, video data, audio data, sensor data, or the like) that is being presented to the remote user 104 in the 3D visualization 118. For example, after the remote user 104 virtually turns in the 3D visualization 118 to view a first region of the industrial system 119 from a second region of the industrial system 119, the computing system 110 may identify one or more sensors associated with the respective industrial automation devices or regions of the industrial system within the first region of the industrial system 119 presented to the remote user 104 in the 3D visualization 118. The computing system 110 may then send a request (e.g., query or ping) the identified sensors for sensor data associated with the industrial automation devices or regions of the industrial system within the first region of the industrial system 119. The computing system 110 may then receive such sensor data from the sensors and send the sensor data to the head mounted device 106 to display the sensor data to the remote user 104 in the visualization 114. For example, the sensor data may be displayed as an overlay proximate to the 3D device visualization associated with the industrial automation device within the first region of the industrial system 119 presented to the remote user 104. In this way, the remote user 104 may alter the amount and/or the type of information displayed to the remote user 104 in the visualization 114 based on visual focus of the remote user 104 in the visualization 114.

As mentioned above, the computing system 110 may be communicatively coupled to the database 112 that may store 3D video associated with an industrial automation device 103, a region of the industrial system, or the industrial system 119. In some embodiments, the database 112 may store a list of gesture commands that are learned or otherwise interpretable by the head mounted device 106 and/or the computing system 110. The database 112 may also store a list of user profiles that include gesture commands that may correspond to specific users 104 of the head mounted device 106.

In other embodiments, the database 112 may store various types of data associated with respective industrial automation devices in the industrial system 119 or the industrial system 119. For example, after detecting a gesture or voice command performed by the remote user 104 to interact with the 3D device visualization 102 or the 3D visualization 118 of the industrial system, the head mounted device 106 of the volumetric 3D imaging system 100 may request data associated with the real-world, industrial automation device 103 from the computing system 110. The computing system 110 may then send a request to the database 112 for the data associated with the 3D device visualization 102 of the industrial automation device. In some embodiments, the computing system 110 and the database 112 may be part of the same device. Additionally, it should be noted that the computing system 110 may be any suitable computing device that includes communication abilities, processing abilities, and the like. For example, the computing system 110 may be any general computing device that may communicate information or data to the head mounted device 106 via the network 108.

The type of information or data associated with the 3D device visualization 102 and requested by the head mounted device 106 may be based on the gesture or voice command performed by the remote user 104 and detected by the head amounted device 106. For example, the remote user 104 may perform a gesture or voice command to display identification data, operational data, maintenance data, specification data, or the like, associated with the real-world, industrial automation device 103 in the visualization 114. In some embodiments, the identification data may include a product name, a product type, a vendor name, a cost, a description of the function of the industrial automation device, or the like. The operational data may include data gathered by one or more sensors in the industrial system 103 that measure one or more operational parameters associated with the industrial automation device 103. The maintenance data may include data associated with maintenance records and/or data logs of the industrial automation device 103. The head mounted device 106 may send a request to the computing system 110 for the type of data associated with the industrial automation device 103 that corresponds to the gesture or voice command performed by the remote user 104. The computing system 110 may then receive the data from the database 112 and send the data to the head mounted device 106. The volumetric 3D imaging system 100 may then modify the visualization 114 to display the requested data via the head mounted device 106. In one embodiment, the requested data may be displayed as an overlay over the 3D device visualization 102 of the industrial automation device 103. For example, the head mounted device 106 may display a virtual representation of the requested data on or adjacent to the 3D device visualization 102 of the industrial automation device 103. In another embodiment, the volumetric 3D imaging system 100 may modify the 3D device visualization 102 of the industrial automation device 103 to integrate the requested data into the appearance of the 3D device visualization 102. For example, the head mounted device 106 may modify exterior surface of the 3D device visualization 102 to display the requested data. In one embodiment, the head mounted device 106 may modify the exterior surface of the 3D device visualization 102 to display thermal data (e.g., a heat map). In another embodiment, the head mounted device 106 may modify the exterior surface of the 3D device visualization 102 to display maintenance information (e.g., a maintenance priority or a maintenance status). As such, the head mounted device 106 may receive various types of data associated with a real-world, industrial automation device 103 or a real-world, industrial system 119 and display the data to the remote user 104 in the visualization 114 of the 3D visualization 118.

The head mounted device 106 may include certain components to facilitate the performance of some of the actions set forth above. FIG. 2 is a block diagram 200 of exemplary components within the head mounted device 106. For example, the head mounted device 106 may include one or more cameras 202 and one or more microphones 204. It should be understood that any suitable image-receiving device may be used in place of, or in addition to, the cameras 202, for example, a singular camera 202 may be incorporated into the head mounted device 106. It also should be understood that any suitable sound-receiving device may be used in place of, or in addition to, the microphones 204, for example, a combined speaker and microphone device, or a singular microphone 204 may be incorporated into the head mounted device 106.

In some embodiments, the head mounted device 106 may include one or more sensors for detecting the movements of the remote user 104, the biometrics of the remote user 104, the surroundings of the remote user 104, or the like. For example, the head mounted device 106 may include an infrared sensor, a thermal sensor, a range sensor (e.g., a range camera), a smell sensor (e.g., an electronic nose), or any other suitable sensors for detecting characteristics of the remote user 104 or the surroundings of the remote user 104.

The head mounted device 106 may also include processing circuitry 206 including a processor 208, a memory 210, a communication component 212, input/output (I/O) ports 214, and the like. The communication component 212 may be a wireless or a wired communication component that may facilitate communication between the head mounted device 106 and the computing system 110, the database 112, and the like via the network 108. This wired or wireless communication protocols may include any suitable communication protocol including Wi-Fi, mobile telecommunications technology (e.g., 2G, 3G, 4G, LTE), Bluetooth®, near-field communications technology, and the like. The communication component 212 may include a network interface to enable communication via various protocols such as Ether-Net/IP®, ControlNet®, DeviceNet®, or any other industrial communication network protocol.

The processor 208 of the head mounted device 106 may be any suitable type of computer processor or microprocessor capable of executing computer-executable code, including but not limited to one or more field programmable gate arrays (FPGA), application-specific integrated circuits (ASIC), programmable logic devices (PLD), programmable logic arrays (PLA), and the like. The processor 208 may, in some embodiments, include multiple processors. The memory 210 may include any suitable articles of manufacture that serve as media to store processor-executable code, data, and the like. The memory 210 may store non-transitory processor-executable code used by the processor 208 to perform the presently disclosed techniques.

Generally, the head mounted device 106 may receive image data or audio data related to the remote user 104 via one or more image sensors (e.g., cameras 202) or one or more audio sensors (e.g., microphones 204), respectively, communicatively coupled to one or more of the I/O ports 214. Upon receiving image data or audio data, the head mounted device 106, via the processor 208, may interpret the image data or the audio data to determine commands or actions for the head mounted device 106 to perform in response to the determined commands or actions. In some embodiments, the determined command may be forwarded to computing system 110 to interpret the detected image data or audio data. The computing system 110 may analyze characteristics of the image data or the audio data to determine if the image data or the audio data matches the characteristic of a gesture command or verbal command, respectively, stored, learned or otherwise interpretable by the computing system 110.

As mentioned above, the database 112 may store a list of gesture or voice commands that are stored, learned, or otherwise interpretably by the computing system 110. For example, the list of gesture or voice commands may include a rotate command, a zoom in command, a zoom out command, a tilt command, one or more navigational commands (e.g., move left, right, forward, backward), an enlarge command, a compact command, or the like. In another embodiment, instead of forwarding the command to the computing system 110, the head mounted device 106 may be able to analyze characteristics of the image data or the audio data to determine if the image data or the audio data matches the characteristic of a gesture or voice command, respectively, stored, learned, or otherwise interpretable by the head mounted device 106. In any case, the head mounted device 106 or the computing system 110 may analyze characteristics of the remote user's movements in the image data such as the motion of the user's hands, wrists, arms, fingers, or any other suitable body part to distinguish one gesture command from another gesture command. Additionally, the head mounted device 106 or the computing system 110 may analyze characteristics of the audio data, such as frequency (e.g., pitch), amplitude (e.g., loudness), or any other suitable characteristic used to distinguish one verbal command from another verbal command.

As discussed above, the head mounted device 106 may be communicatively coupled to the network 108, which may include an Internet connection, or otherwise suitable wireless or wired communicative coupling to expand its interpretation and functional capabilities, but, in some embodiments, the head mounted device 106 may not rely on such a communicative coupling. In other words, the head mounted device 106 may have particular capabilities that may function without an Internet, wireless, or wired connection. For example, the head mounted device 106 may perform local command interpretation without an Internet or wireless connection.

The head mounted device 106 may also include a video output 216. The video output 216 may be any suitable image-transmitting component, such as a display. For example, the head mounted device 106 may display a visualization 114 associated with the volumetric 3D imaging environment that combines computer-generated content, such as a 3D device visualization 102 of an industrial automation device 103, with real-world content, such as image data associated with the user's physical surroundings. In another example, the head mounted device 106 may have a transparent display and display a visualization 114 of real-world content, computer-generated content, or both, superimposed over the transparent display to produce virtual or 3D objects within real-world surroundings.

Figure 3:
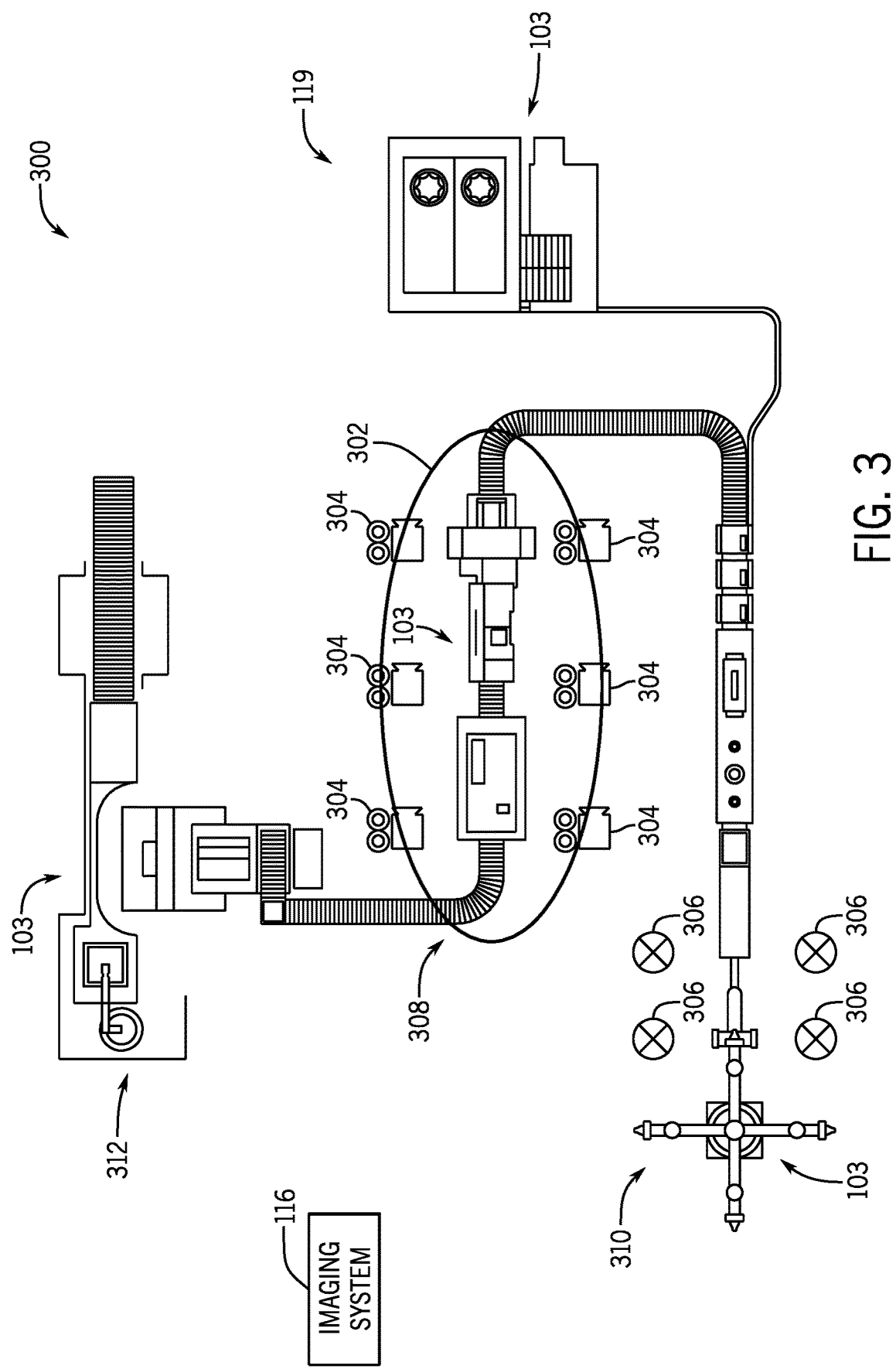
FIG. 3 is a schematic of an exemplary imaging system of the volumetric 3D imaging system of FIG. 1 that may be utilized to capture image data of the industrial system, in accordance with an embodiment.

With the foregoing in mind, FIG. 3 illustrates a schematic diagram 300 of a real-world, industrial system 119 having various types of industrial automation devices 103 that may be monitored via the imaging system 116. As mentioned above, the imaging system 116 may acquire image data associated with the real-world, industrial system 119 via image acquisition hardware 117 (e.g., one or more mobile cameras 304, 306). In some embodiments, the imaging system 116 may have at least four mobile cameras 304, 306 positioned about the industrial system 119 that may acquire image data associated with the industrial system 119. It should be understood, however, that any suitable number of mobile cameras 304, 306 may be used to acquire the image data associated with the industrial system 119. In some embodiments, the mobile cameras 304, 306 may include one or more depth cameras, one or more stereo cameras, one or more RGB-D cameras, or any other suitable image-receiving device that may acquire image data that may be used to generate 3D video (e.g., volumetric video) of the industrial system 119.

In one embodiment, as illustrated in FIG. 3, the imaging system 116 may include a set of cameras 304 mounted on an overhead track 302 (e.g., a linear motor track or other moveable track) above the industrial system 119. As mentioned above, the imaging system 116 may receive a request from the computing system 110 for image data associated with a particular industrial automation device 103 or a region of the industrial system 119. In some embodiments, the request may include identification data associated with the particular industrial automation device 103 or the particular region of the industrial system 119. After receiving the request, the imaging system 116 may send a command signal to the mobile cameras 304 to move to respective positions and/or orientations to acquire image data associated with the industrial automation device 103 or the region of the industrial system 119. In some embodiments, the imaging system 116 may determine a desired position and/or orientation for each mobile camera 304 to acquire the image data based on the identification data associated with the industrial automation device 103 or the region of the industrial system 119 in the request. For example, the desired positions and/or orientations of each mobile camera 304 may include optimal positions and/or optimal orientations to acquire image data that may be used to generate 3D video of the industrial automation device 103 or the region of the industrial system 119 by the computing system 110. In another example, each mobile camera 304 may be positioned in the desired positions and/or orientations such that a sufficient amount image data associated with the industrial automation device 103 or the requested region of the industrial system 119 may be obtained by the set of mobile cameras 304.

Each mobile camera 304 in the set of mobile cameras 304 may be attached to an overhead track 302 in the industrial system 119. In the illustrated embodiment, the overhead track 302 is elliptical in shape. It should be understood, however, that the illustrated embodiment is intended to be exemplary and non-limiting and that other shapes or other configurations of the overhead track 302 may be utilized for positioning the cameras 304 at desired positions and/or orientations about the industrial system 103. For example, the overhead track 302 may include one or more rows, one or more columns, a grid-like configuration, a circular configuration, a rectangular configuration, or the like, such that the mobile cameras 304 may be positioned and/or oriented in any region of the industrial system 119.

After determining the desired position and/or orientation of each mobile camera 304, the imaging system 116 may send a command signal indicative of the desired position and/or orientation to the mobile cameras 304 to move to the desired position and/or orientation. In some embodiments, the imaging system 116 may send the command signal to the overhead track 302 which may actuate one or more motors to move each mobile camera 304 to respective desired positions and/or orientations along the overhead track 302. For example, each mobile camera 304 may be mounted to a linear motor that may move along the overhead track 302. In some embodiments, the overhead track 302 may also be mounted to a secondary track that may position the overhead track 302 in a region of the industrial system 119. For example, the imaging system 116 may send a command signal indicative of a desired position and/or orientation of the overhead track 302 to the secondary track to move the overhead track to the desired position and/or orientation. In any case, after the mobile cameras 304 have moved to the respective desired positions and/or orientations, the mobile cameras 304 may acquire image data of the industrial automation device 103 or the region of the industrial system 119.

In another embodiment, as illustrated in FIG. 3, the imaging system 116 may include one or more drone devices 306 that may maneuver within the industrial system 119 to acquire image data with a particular industrial automation device 103 or a region of the industrial system 119. As described above, the imaging system 116 may receive a request from the computing system 110 for image data associated with a particular industrial automation device 103 or a region of the industrial system 119. After receiving the request, the imaging system 116 may determine a desired position and/or orientation of each drone device 306 within the industrial system 119 to acquire the image data associated with the industrial automation device 103 or the region of the industrial system 119 indicated in the request. The imaging system 116 may then send a command signal indicative of the desired position and/or orientation to each drone device 306. After receiving the command signal, the drone device 306 may automatically move to the desired position and/or orientation and acquire image data associated with the requested industrial automation device 103 or the requested region of the industrial system 119.

In some embodiments, the desired position and/or orientation determined by the imaging system 116 for each mobile camera 304 or each drone device 306 may include a cell or region identifier. For example, the industrial system 119 may be split into two or more predetermined cells or regions that include one or more industrial automation devices 103. After receiving the request from the computing system 110 to acquire imaging data associated with a particular industrial automation device 103, the imaging system 116 may compare identification data associated with one or more industrial automation devices in the request to a list of industrial automation devices 103 indexed by location within a particular cell or region of the industrial system 119. The imaging system 116 may then determine which cell or region the industrial automation device 103 is located in based on the comparison and send a command signal indicative of the cell or region to, for example, the overhead track 302 or the drone devices 306. The mobile cameras 304 or the drone devices 306 may then automatically move to the cell or region of the industrial system 119 and acquire image data associated with the one or more industrial automation devices 103 within the cell or region of the industrial system 119.

Figure 4:
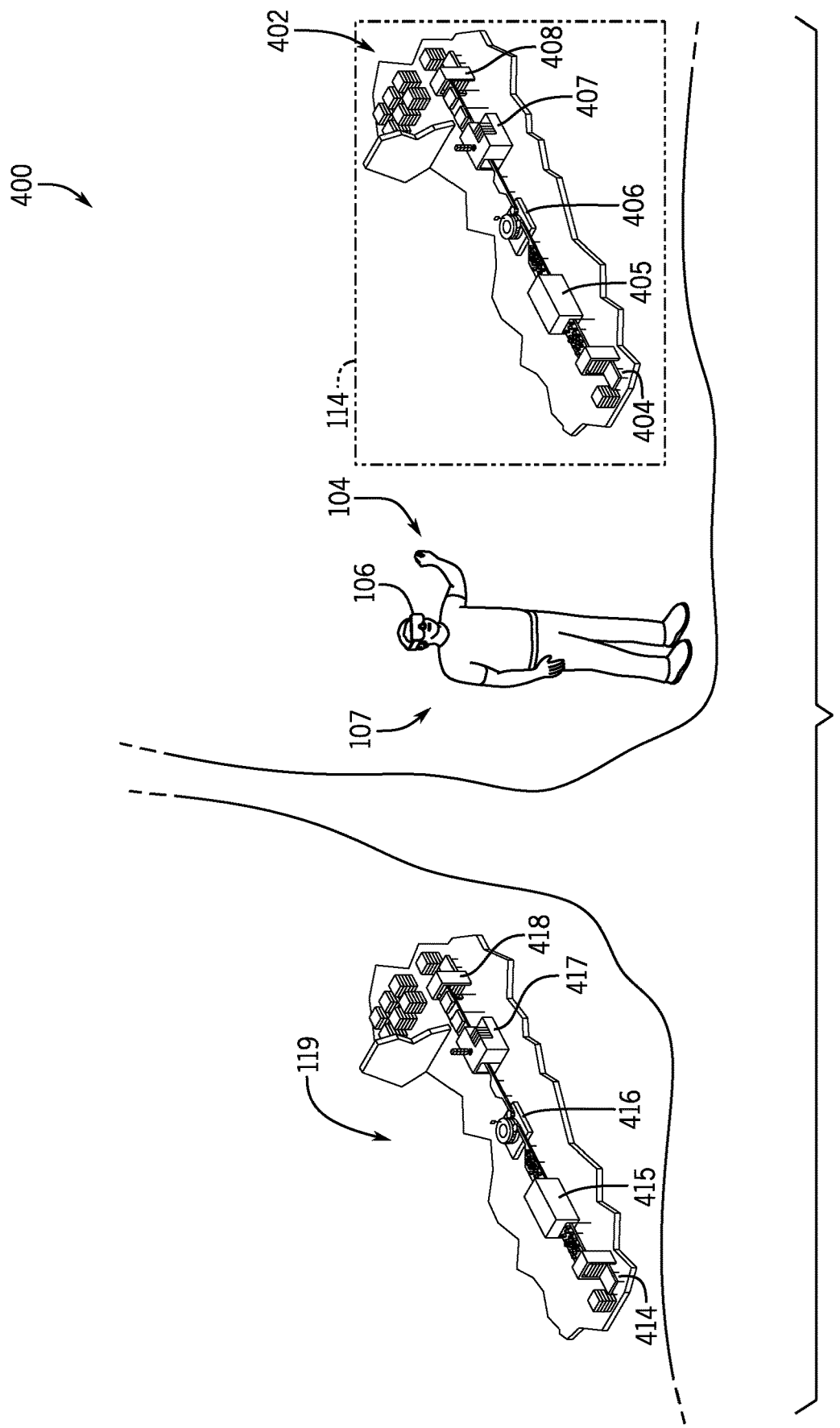
FIG. 4 is a perspective view of an exemplary visualization of the industrial system that may be perceived by the remote user utilizing the display device of FIG. 2, in accordance with an embodiment.

With the foregoing in mind, FIG. 4 illustrates a perspective view of a visualization 114 of the 3D visualization 118 that may be perceived by the remote user 104 via the head mounted device 106 in a location 107 different than the real-world, industrial system 119. As described above, the volumetric 3D imaging system 100 may display the 3D visualization 118 as a 3D representation 402 that the remote user 104 may view and interact with. The 3D representation 402 may include one or more 3D device visualizations 404, 405, 406, 407, 408 that correspond to respective real-world, industrial automation devices 414, 415, 416, 417, 418 in the real-world, industrial system 119. Additionally, the 3D representation 402 of the industrial system 119 and the 3D device visualizations 404, 405, 406, 407, 408 within the 3D representation 402 may be proportionally sized with respect to the real-world, industrial system 119 and the real-world industrial automation devices 414, 415, 416, 417, 418.

The head mounted device 106 may detect a gesture or voice command performed by the remote user 104 that corresponds to a selection of the 3D representational view or perspective of the 3D visualization 118. In some embodiments, the selection may include the particular real-world, industrial system 119 to be visualized as the 3D representations 402. For example, the head mounted device 106 may display a list of real-world, industrial systems 119 that may be displayed as a 3D representation 402 in the visualization 114 displayed to the remote user 104. The list may comprise names, locations, or other suitable identifying features associated with each real-world, industrial system 119. In some embodiments, the list of real-world, industrial systems 119 may be displayed as a series of 3D representations (e.g., 402) that the remote user 104 may select from or scroll through by perform various gesture or voice commands.

After the head mounted device 106 has detected that the remote user 104 has selected a particular real-world, industrial system 119 to be displayed as a 3D representation (e.g., via one or more detected gesture or voice commands performed by the remote user 104), the head mounted device 106 may send a request to the computing system 110 for 3D video associated with the selected real-world, industrial system 119. As described herein, the computing system 110 may request image data from the imaging system 116 and generate 3D video (e.g., a 3D point cloud) based on image data received from the imaging system 116. After generating the 3D video, the computing system may send the 3D video to the head mounted device 106. The head mounted device 106 may then process the 3D video and display the 3D representation 402 of the selected real-world, industrial system 119 such that the 3D representation 402 appears the same as or substantially similar to the state or the appearance of the real-world, industrial system 119 in real-time or substantially real-time. In some embodiments, the 3D representation 402 of the industrial system 119 may be displayed to the remote user 104 in the visualization 114 at a default or predetermined viewing angle, at a default or predetermined scale, with a default or predetermined amount of detail, or the like. However, the remote user 104 may customize such default or predetermined settings via one or more gesture or voice commands detected by the head mounted device 106.

Figure 5:
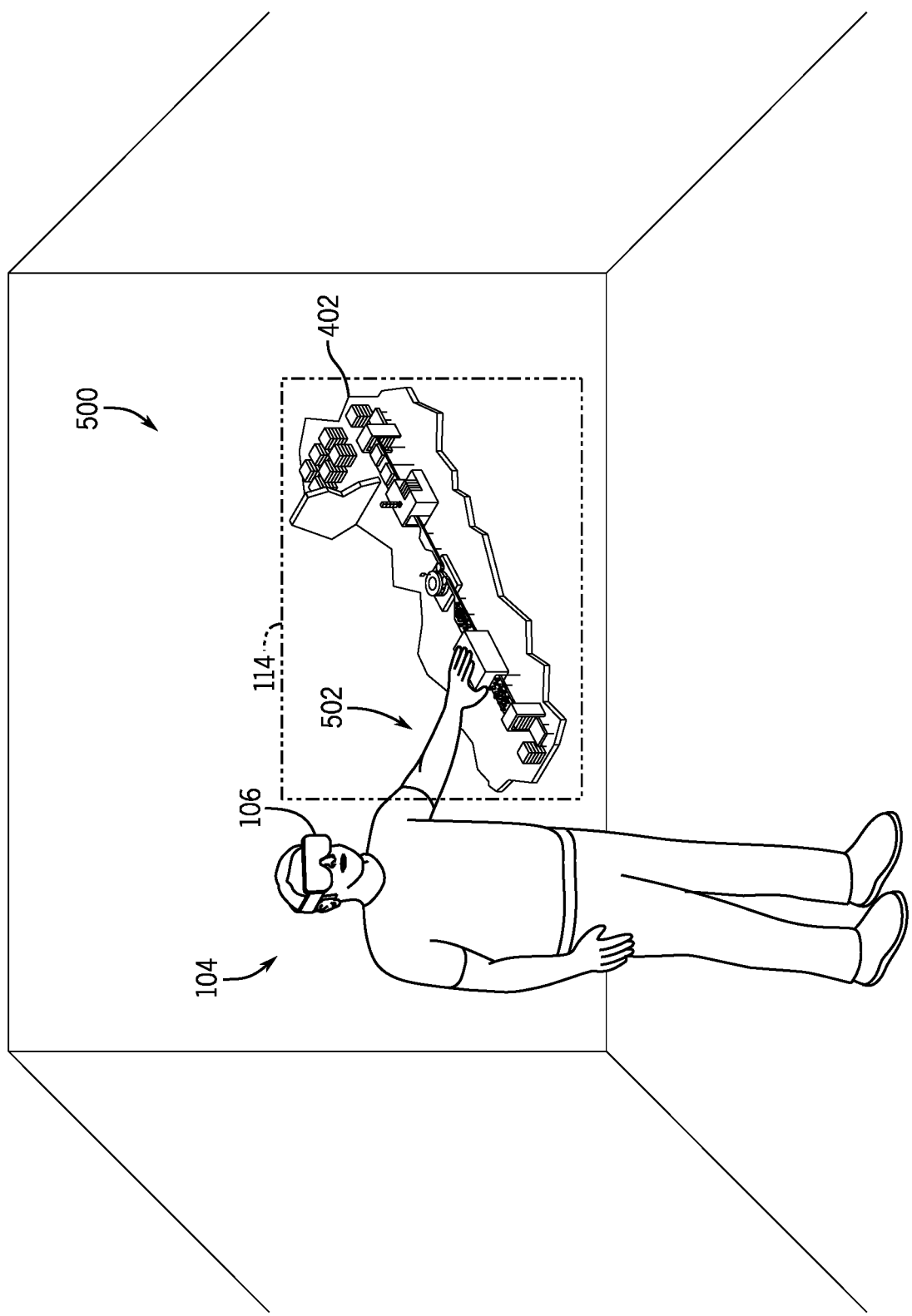
FIG. 5 is perspective view of an exemplary 3D visualization of the industrial system that may be perceived by the remote user utilizing the display device of FIG. 2 after performing a rotate command, in accordance with an embodiment.

In some embodiments, the remote user 104 may wish to interact with (e.g., manipulate) the 3D representation of the industrial system to acquire information associated with the real-world, industrial system, one or more real-world, industrial automation devices, or a combination thereof. As such, the remote user 104 may perform one or more gestures or voice commands that may be detected by the head mounted device 106 to manipulate the appearance of the 3D representation 402 of the industrial system 119 to the remote user 104 in the visualization 114. By way of example, FIG. 5 illustrates a perspective view of the remote user 104 utilizing the head mounted device 106 to grasp the 3D representation 402 of the real-world, industrial system 119 in the visualization 114. The head mounted device 106 may detect a grasping gesture command 502 performed by the remote user 104 and targeted at the 3D representation 402. For example, the head mounted device 106 may receive image data associated with the remote user 104 and the remote user's surroundings and detect the grasping gesture command based on the image data. In some embodiments, the head mounted device 106 may identify one or more mapping points associated with the remote user's hand that performed the grasping gesture command 502. After the head mounted device 106 has detected the grasping gesture command 502, the head mounted device 106 may modify the visualization 114 and map the 3D representation 402 of the industrial system 119 to the remote user's hand that performed the grasping gesture 502 command at the one or more identified mapping points. Thereafter, as the remote user 104 moves the remote user's hand in the visualization 114, the head mounted device 106 may continuously modify the visualization 114 to move (e.g., as an animation) the 3D representation 402 toward and stay attached to the one or more identified mapping points associated with the remote user's hand until another gesture or voice command is detected. That is, the remote user 104 may move the 3D representation 402 in the visualization 114 in real-time or substantially real-time after performing a grasping gesture command 808 targeted at the 3D representation 402 in the visualization 114. Alternatively, the remote user 104 may issue a voice command (e.g., "grasp left" or "grasp right") to map the 3D representation 402 of the industrial system 119 to a respective hand of the remote user 104. The head mounted device 106 may detect the voice command based on audio data associated with the remote user 104.

Figure 6:
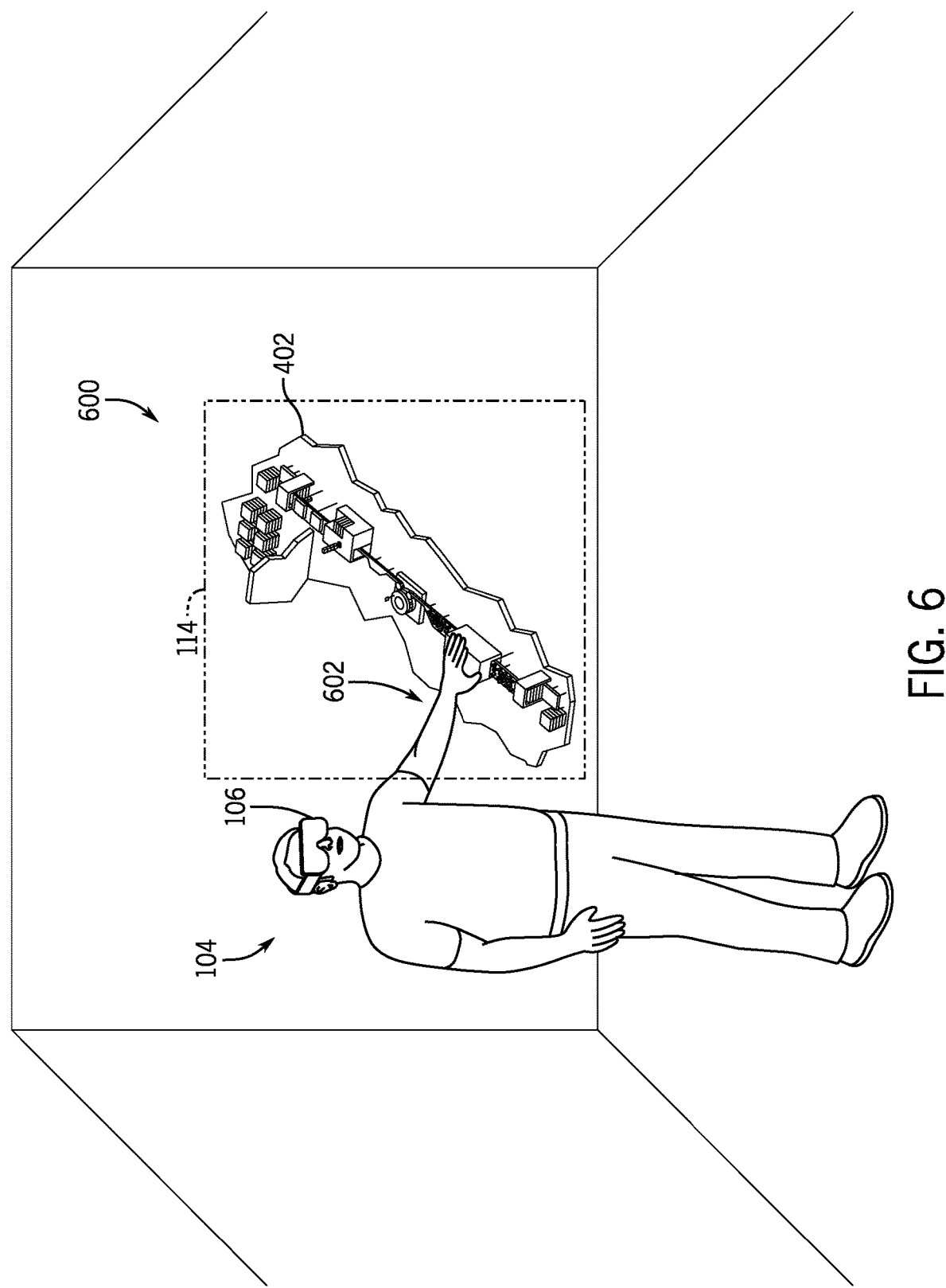
FIG. 6 is a perspective view of an exemplary 3D visualization of the industrial system that may be perceived by the remote user utilizing the display device of FIG. 2 after performing a zoom in command, in accordance with an embodiment.

After the remote user 104 has grasped the 3D representation 402 in the visualization 114, the remote user 104 may wish to further manipulate the 3D representation 402 of the industrial system 119 in the visualization. By way of example, FIG. 6 illustrates a perspective view 600 of the remote user 104 utilizing the head mounted device 106 to rotate the 3D representation 402 of the real-world, industrial system 119 in the visualization 114. For example, the head mounted device 106 may detect a gesture of voice command performed by the remote user 104 indicative of a command to rotate the 3D representation 402 of the industrial system 119.

The head mounted device 106 may receive image data associated with the remote user 104. Based on the image data associated with the remote user 104 and the 3D representation 402 of the industrial system 119 in the visualization 114, the head mounted device 106 may detect a rotate gesture command 602 performed by the remote user 104. For example, the head mounted device 106 may determine that the remote user 104 has placed one or both hands on a virtual edge of the 3D representation 402 by determining that the positions of the user's hands (e.g., fingers, palm, wrist, or a combination thereof) align or overlap with a boundary (e.g., the virtual edge) where two virtual surfaces of the 3D representation 402 of the industrial system 119 intersect. Alternatively, the remote user 104 may issue a voice command (e.g., "rotate") to rotate the 3D representation 402 of the industrial system 119. The head mounted device 106 may detect the voice command based on audio data associated with the remote user 104.

In some embodiments, the head mounted device 106 may determine a direction of rotation and a speed of rotation based on the gesture command performed by the remote user 104. For example, the head mounted device 106 may extract motion data from the image data acquired of the remote user 104 to detect the gesture command. In another example, the speed of rotation may be set to a predetermined value and the remote user 104 may increase or decrease the speed of rotation by issuing a corresponding gesture command or voice command (e.g., "faster" or "slower"). In any case, after the head mounted device 106 has detected the gesture or voice command performed by the remote user 104 to rotate the 3D representation 402 of the industrial system 119, the head mounted device 106 may display a modified visualization 114 of the 3D representation 402 of the industrial system 119 being rotated at the direction of rotation and the speed of rotation. In some embodiments, the modified visualization 114 may include a rotation animation associated with the rotation of the 3D representation 402.

It should be noted that the grasp command of FIG. 5 and the rotate command of FIG. 6 are intended to be exemplary and non-limiting and that other gesture commands and voice command may be performed that provide similar interactions with the 3D representation 402 as described herein or similar gesture commands and voice commands may be performed that provide different interactions with the 3D representation 402. For example, the remote user 104 may perform a "zoom in" gesture or voice command to zoom into a particular 3D device visualization 404, 405, 406, 407, 408 of real-world, industrial automation devices 414, 415, 416, 417, 418 in the 3D representation 402 of the industrial system 119 or a particular region of the 3D representation 402 of the industrial system 119. In another example, the remote user 104 may perform a "zoom out" gesture or voice command to zoom out of viewing a particular 3D device visualization 404, 405, 406, 407, 408 in the 3D representation 402 of the industrial system 119 or a particular region of the 3D representation 402 of the industrial system 119. In another example, the remote user 104 may perform a "tilt" gesture or voice command to alter the angle at which the remote user 104 is viewing the 3D representation 402 of the industrial system 119.

Additionally, it may be beneficial for the remote user 104 to see other types of information associated with the real-world, industrial system 119 and/or the real-world, industrial automation devices 414, 415, 416, 417, 418. As such, the remote user 104 may perform various gesture or voice commands to display different types of information associated with the real-world, industrial system 119 and/or the real-world, industrial automation devices 414, 415, 416, 417, 418 in the visualization 114. For example, after detecting a gesture or voice command indicative of a selection of a type of information to be displayed within the visualization 114 of the 3D representation 402 of the industrial system 119, the head mounted device 106 may send a request for the selected type of information to the computing system 110 and receive the requested type of information from the computing system 110 and/or the database 112. For example, the requested information may include identification data, operational data, maintenance data, specification data, or the like, associated with a 3D device visualization 414, 415, 416, 417, 418 or the 3D representation 402.

After receiving the requested information, the head mounted device 106 may modify the visualization 114 to display the requested information to the remote user 104. In some embodiments, the requested information may modify how the 3D representation 402 of the industrial system 119 appears to the remote user 104. For example, by default, the 3D representation 402 may appear substantially similar to the real-world, industrial system 119 based on the 3D video received from the computing system 110. However, the remote user 104 may perform a gesture or voice command to change the appearance of the 3D representation 402 of the industrial system 119 to represent operational or maintenance information associated with the industrial system 119 or respective industrial automation devices 414, 415, 416, 417, 418. In one embodiment, the remote user 104 may perform a gesture or voice command to view thermal data associated with the real-world, industrial system 119. After detecting the gesture or voice command performed by the remote user 104 and receiving thermal data from the computing system 110 (e.g., via sensors, infrared cameras, multi-purpose cameras, or the like, in the industrial system 119), the head mounted device 106 may modify the visualization 114 of the 3D representation 402 to include the thermal data. For example, the 3D representation 402, or portions thereof, may be rendered as a heat map. In some embodiments, the remote user 104 may perform a gesture or voice command to switch between different views of the 3D representation 402 of the industrial system 119. For example, the remote user 104 may switch between the real-world view of the industrial system 119 and the thermal or heat map view of the industrial system 119 by performing a particular gesture or voice command.

In another example, the remote user 104 may perform a gesture or voice command to view the location of one or more real-world, industrial automation devices 414, 415, 416, 417, 418 having maintenance issues. After detecting the gesture or voice command performed by the remote user 104 and receiving maintenance data associated with the industrial automation devices 414, 415, 416, 417, 418 from the computing system 110, the head mounted device 106 may modify the 3D representation 402 of the industrial system 119 to color, texture, highlight, or the like, each 3D device visualization 404, 405, 406, 407, 408 in the 3D representation 402 of the industrial system 119 to indicate the location of the real-world, industrial automation devices 414, 415, 416, 417, 418 that have maintenance issues. As such, the volumetric 3D imaging system 100 may visualize and display real-time or substantially real-time data associated with the real-world, industrial system 119 to the remote user 104 without the remote user 104 having to leave the volumetric 3D imaging environment.

Figure 7:
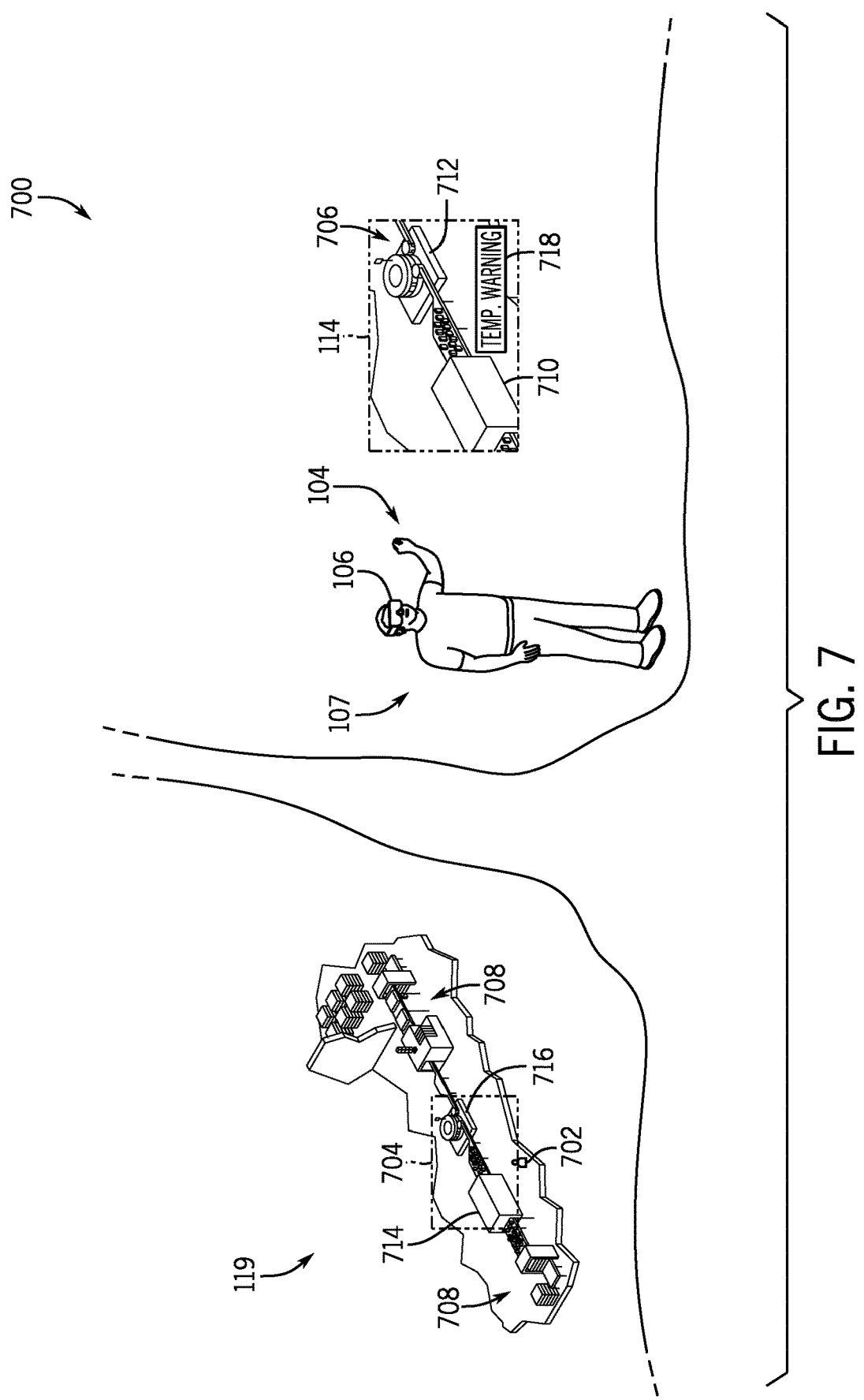
FIG. 7 is a perspective view of an exemplary 3D visualization of the industrial system at a first location within the 3D visualization that is perceived by the remote user utilizing the display device of FIG. 2 in a first-person perspective, in accordance with an embodiment.
Figure 8:
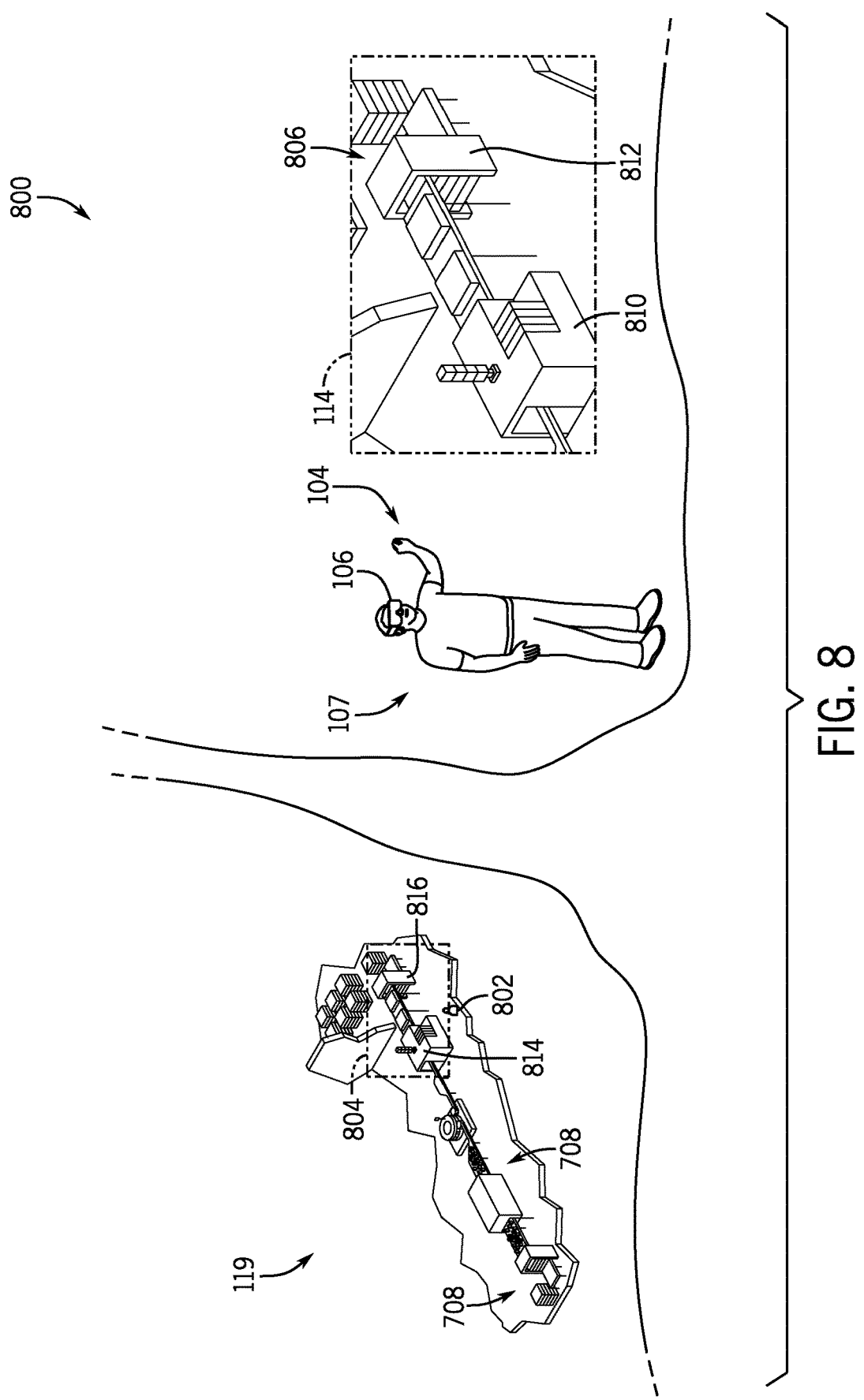
FIG. 8 is a perspective view of an exemplary 3D visualization of the industrial system at a second location within the 3D visualization that is perceived by the remote user utilizing the display device of FIG. 2 in the first-person perspective, in accordance with an embodiment.

As mentioned above, the volumetric 3D imaging system 100 may virtually position the remote user 104 in the 3D visualization 118 of the industrial system 119 such that the remote user 104 may acquire a first-person perspective of the 3D visualization 118 and interact with or navigate through (e.g., walk around or move around) the 3D visualization 118). In this way, the remote user 104 may acquire a perspective of the 3D visualization 118 similar to the real-world perspective that the remote user 104 would receive when visiting the real-world, industrial system 119. With the foregoing in mind, FIGS. 7 and 8 illustrate respective perspective views 700, 800 of the remote user 104 utilizing the head mounted device 106 to perceive the 3D visualization 118 from a first-person point of view. For example, the first-person point of view may be the same or substantially similar to the first-person perspective that the remote user 104 would receive when visiting the real-world, industrial system 119. By way of example, FIG. 7 illustrates a perspective view 700 of the first-person point of view that the remote user 104 may perceive of a first region 706 of the 3D visualization 118 of the industrial system 119 in the visualization 114. As illustrated in FIG. 7, the remote user 104 may be viewing the first region 706 of the 3D visualization 118 from a first virtual location that corresponds to a first real-world location 702 within the real-world, industrial system 119. For example, the head mounted device 106 may display the visualization 114 of the first region 702 of the 3D visualization 118 based on 3D video of the first region 704 of the real-world, industrial system 119 such that the first region 702 of the 3D visualization 118 may appear the same or substantially similar to the first region 704 of the real-world, industrial system 119. As such, the remote user's perspective of the first region 706 of the 3D visualization 118 may include one or more 3D device visualizations 710, 712 that correspond to one or more respective real-world, industrial automation devices 714, 716 that would appear in the remote user's perspective of the first region 704 of the real-world, industrial system 119.

To further illustrate, the remote user's perspective of the 3D visualization 118 of the industrial system 119 may be limited by a virtual radius or a virtual distance similar to that of the remote user's perspective in the real-world, industrial system 119. In the illustrated embodiment, the remote user 104 may not be able to view regions of the 3D visualization 118 that correspond to respective regions 708 of the real-world, industrial system 119 until the remote user 104 navigates away from the remote user's current position in the 3D visualization 118. For example, the virtual radius or the virtual distance may define the limit of which regions of the 3D visualization 118 that the remote user 104 may view in the visualization 114. The regions of the 3D visualization 118 that correspond to the regions 708 of the real-world, industrial system 119 may not be present within the virtual radius or the virtual distance from the current position of the remote user 104 within the 3D visualization 118. In some embodiments, the virtual radius or the virtual distance may be fifty virtual feet, one hundred virtual feet, one thousand virtual feet, or any other suitable distance. However, the remote user 104 may change such settings via one or more gesture or voice commands detected by the head mounted device 106.

The head mounted device 106 may detect a gesture or voice command performed by the remote user 104 that corresponds to a selection to view the 3D visualization 118 from the first-person perspective. In some embodiments, the selection may include the particular real-world, industrial system 119 to be visualized in the first-person perspective by the remote user 104 via the head mounted device 106. After detecting the gesture or voice command corresponding to the first-person perspective view, the head mounted device 106 may send a request to the computing system 110 for 3D video associated with the selected real-world, industrial system 103. As described herein, the computing system 110 may request image data from the imaging system 116 and generate 3D video (e.g., a 3D point cloud) based on image data received from the imaging system 116. After generating the 3D video, the computing system may send the 3D video to the head mounted device 106. The head mounted device 106 may then process the 3D video and display the 3D visualization 118 associated with the real-world industrial system 119 to the remote user 104 in the visualization 114 such that the remote user 104 may view the 3D visualization 118 from the first-person perspective view.

In some embodiments, the remote user 104 may wish to interact with and/or navigate through the 3D visualization 118 of the industrial system 119, one or more 3D device visualizations 710, 712 in the 3D visualization 118, or a combination thereof. As such, the remote user 104 may perform one or more gesture or voice commands that may be detected by the head mounted device 106 to modify the 3D visualization 118 and/or the 3D device visualizations 710, 712 displayed in the visualization 114 to the remote user 104. By way of example, FIG. 8 illustrates a perspective view 800 of the first-person point of view that the remote user 104 may perceive of a second region 806 of the 3D visualization 118 in the visualization 114. As illustrated in FIG. 8, the remote user 104 may be viewing the second region 806 of the 3D visualization 118 from a second virtual location that corresponds to a second real-world location 802 within the real-world, industrial system 119. For example, the head mounted device 106 may display the second region 802 of the 3D visualization 118 in the visualization 114 based on 3D video of the second region 804 of the real-world, industrial system 119 such that the second region 802 of the 3D visualization 118 may appear the same or substantially similar to the second region 804 of the real-world, industrial system 119. As such, the remote user's perspective of the second region 806 of the 3D visualization 118 may include one or more 3D device visualizations 810, 812 that correspond to one or more respective real-world, industrial automation devices 814, 816 that would appear in the remote user's perspective of the second region 804 of the real-world, industrial system 119. Additionally, as illustrated in FIG. 8, the remote user 104 may not be able to view regions of the 3D visualization 118 that correspond to respective regions 708 of the real-world, industrial system 119 until the remote user 104 navigates away from the remote user's current position in the 3D visualization 118.

As such, the remote user 104 may navigate (e.g., walk around or move around) the 3D visualization 118 of the industrial system 119 to view and/or interact with other 3D device visualizations 810, 812 and/or other regions of the 3D visualization 118 not currently in the remote user's view of the 3D visualization 118. For example, as the remote user 104 navigates through the 3D visualization 118 (e.g., from the virtual position of the remote user 104 of FIG. 7 to the virtual position of the remote user 104 in FIG. 8), the head mounted device 106 may detect that the remote user 104 is navigating to a region past the virtual radius or virtual distance from the remote user 104 that defines the rendered region (e.g., the first region 706) of the 3D visualization 118 of the industrial system 119. The head mounted device 106 may send a request to the computing system 110 for the 3D video. As described herein, the computing system 110 may request image data from the imaging system 116 and generate 3D video (e.g., a 3D point cloud) based on image data received from the imaging system 116. After generating the 3D video, the computing system may send the 3D video to the head mounted device 106. The head mounted device 106 may then process the 3D video and modify the visualization 114 to display the previously, non-rendered region (e.g., the second region 806) based on the 3D video of the corresponding region (e.g., the second region 804) in the real-world, industrial system 119. In this way, the head mounted device 106 and the computing system 110 may modify or update the visualization 114 displayed to the remote user 104 on an "as needed" basis by displaying real-time or substantially real-time data associated with the region of the 3D visualization 118 that is of interest to the remote user 104 at a particular point in time.

In one embodiment, modifying the visualization 114 displayed to the remote user 104 may include removing one or more portions of a first 3D device visualization while adding one or more portions of a second 3D device visualization. For example, the head mounted device 114 may initially display the first 3D device visualization of a first industrial automation device, or a portion thereof, to the remote user 104. As the remote user 104 moves in a direction toward a second 3D device visualization of a second industrial automation device, the head mounted device 106 and the computing system 110 may modify the visualization 114 to fade the first 3D device visualization, or portions thereof, from the remote user's view of the 3D visualization 118 and fade the second 3D device visualization, or portions thereof, into the remote user's view of the 3D visualization 118 as the remote user 104 moves toward the second 3D device visualization. In some embodiments, the head mounted device 106 may track a movement direction and a movement speed of the remote user 104 in the 3D visualization 118. In such embodiments, the visualization 114 may be updated or modified to include the second 3D device visualization, or portions thereof, and remove the first 3D device visualization, or portions thereof, at a virtual rate that corresponds to the movement speed of the remote user 104 and in a virtual direction that corresponds to the movement direction of the remote user 104.

Additionally, as similarly described with respect to FIGS. 4-6, the remote user 104 may wish to interact with the region 706, 806 of the 3D visualization 118 or one or more 3D device visualizations 710, 712, 810, 812 within the region 706, 806 of the 3D visualization 118 displayed to the remote user 104 in the visualization 114. For example, the head mounted device 106 may detect various gesture or voice commands corresponding to respective interactions with the 3D visualization 118. As described above, the gesture or voice commands may include a grasping command, a rotate command, a zoom in command, a zoom out command, a tilt command, a data provision command, or the like.

As described above, the remote user 104 may perform a gesture or voice command to display identification data, operational data, maintenance data, specification data, or the like, associated with the real-world, industrial automation device 714 in the visualization 114. As illustrated in FIG. 7, for example, the head mounted device 106 may display the visualization 114 with an operational data overlay 718, such as a temperature sensor reading, associated with the industrial automation device 714. In another embodiment, the volumetric 3D imaging system 100 may modify the 3D device visualization 102 of the industrial automation device 103 to integrate the requested data into the appearance of the 3D device visualization 102. For example, the head mounted device 106 may modify exterior surface of the 3D device visualization 102 to display the requested data. In one embodiment, the head mounted device 106 may modify the exterior surface of the 3D device visualization 102 to display thermal data (e.g., a heat map). In another embodiment, the head mounted device 106 may modify the exterior surface of the 3D device visualization 102 to display maintenance information (e.g., a maintenance priority or a maintenance status). As such, the head mounted device 106 may receive various types of data associated with a real-world, industrial automation device 103 or a real-world, industrial system 119 and display the data to the remote user 104 in the visualization 114 of the 3D visualization 118.

With the foregoing in mind, FIG. 9 illustrates a flow chart of a method 900 for displaying the visualization 114 based on one or more gesture or voice commands indicative of a selection to view a real-world, industrial system 119 as a 3D representation 402 or from a first-person perspective via the head mounted device 106. Although the following description of the method 900 is described in a particular order, it should be noted that the method 900 is not limited to the depicted order, and instead, the method 900 may be performed in any suitable order. Moreover, although the method 900 is described as being performed by the head mounted device 106 and the computing system 110, it should be noted that it may be performed by any suitable computing device communicatively coupled to the head mounted device 106 or the computing system 110.

Referring now to FIG. 9, at block 902, the head mounted device 106 may detect a gesture or voice command that corresponds to a selection of the particular real-world, industrial system 119 to be visualized as the 3D representation 402. At block 904, the head mounted device 106 may detect an additional gesture or voice command performed by the remote user 104 that corresponds to a selection of the 3D representational view (e.g., FIGS. 4-6) or the first-person perspective view (e.g., FIGS. 7 and 8) of the real-world, industrial system 119. In some embodiments, the gesture or voice command detected by the head mounted device 106 at block 902 may be the same gesture or voice command detected by the head mounted device 106 at block 904. That is, the selection of the particular industrial system 119 to display in the visualization 114 and the selection of the 3D representational view or the first-person perspective view of the industrial system may be a single selection detected by the head mounted device 106. After detecting the selection of the industrial system 119 and the selection of the 3D representational view or the first-person perspective view of the industrial system, the head mounted device 106 may send a request to the computing system 110 for 3D video associated with the selected real-world industrial system 119. As described herein, the computing system 110 may request image data from the imaging system 116 based on the request received from the head mounted device 106. For example, the request received from the head mounted device 106 may include an identifier associated with the real-world, industrial system 119, one or more real-world industrial automation devices within the real-world, industrial system, one or more regions of the real-world, industrial system 119, or a combination thereof. The computing system 110 may then request image data based on the identifiers included in the request from the head mounted device 106. After receiving the requested image data from the imaging system 116 at block 906, the computing system 110 may generate 3D video (e.g., volumetric video) based on the received image data at block 908. For example, the computing system 110 may generate a 3D point cloud associated with the industrial system 119, the industrial automation devices, the regions of the industrial system, or a combination thereof. The 3D point cloud may be processed to generate 3D surfaces of the 3D visualization 118 and/or respective 3D device visualizations (e.g., that corresponds to industrial automation devices in the industrial system) that may be used to generate the 3D visualization 118 and/or the 3D device visualizations in the visualization 114.

The computing system 110 may then send the 3D video to the head mounted device 106. After receiving the 3D video from the computing system 110, the head mounted device 106 may process the 3D video and generate and display either the 3D representational view or the first-person perspective view of the industrial system 119 in the visualization 114 to the remote user 104 at block 910. As such, components of the volumetric 3D imaging system 100 may facilitate various views or perspectives of the 3D visualization 118 of the real-world, industrial system 119 in real-time or substantially real-time via the head mounted device 106 to the remote user 104.

As described above, as the remote user 104 interacts with the visualization 114 of the 3D representation 402 of the industrial system 119 or interacts with or navigates through the 3D visualization 118 of the industrial system 119, the head mounted device 106 may detect additional gesture or voice commands performed by the remote user 104. For example, the gesture or voice commands may include a tilt command, a rotate command, a zoom in command, a zoom out command, a data provision command, a navigational command, or the like. As the remote user 104 interacts with the 3D representation 402 or interacts with or navigates through the 3D visualization 118, the head mounted device 106 may determine whether additional 3D video is needed to update or modify the visualization 114 based on the detected gesture or voice commands performed by the remote user 104. With the foregoing in mind, FIG. 10 illustrates a flow chart of a method 1000 for modifying the 3D representation 402 or the 3D visualization 118 in the visualization 114 based on the remote user's interaction with the 3D representation 402 or the remote user's interaction with or navigation through the 3D visualization 118. Although the following description of the method 1000 is described in a particular order, it should be noted that the method 1000 is not limited to the depicted order, and instead, the method 1000 may be performed in any suitable order. Moreover, although the method 1000 is described as being performed by the head mounted device 106 and the computing system 110, it should be noted that it may be performed by any suitable computing device communicatively coupled to the head mounted device 106 or the computing system 110.

Referring now to FIG. 10, at block 1002, the head mounted device 106 may detect a gesture or voice command performed by the remote user 104 and associated with the 3D representation 4023D visualization 118. As described herein, the gesture or voice command may include a tilt command, a rotate command, a zoom in command, a zoom out command, a data provision command, a navigational command, or the like. After detecting the gesture or voice command, the head mounted device 106 may determine whether additional 3D video is needed to modify the 3D representation 402 or the 3D visualization 118 at block 1004. For example, the head mounted device 106 may determine that additional 3D video is needed if the remote user 104 is performing a navigational command within the 3D visualization 118 and is moving toward a non-rendered region of the 3D visualization 118. In another example, the head mounted device 106 may determine that additional 3D video is needed if the remote user 104 is tilting the 3D representation 402 to a different angle than it currently is displayed in. One or more portions of the 3D representation 402, for example, may not have been rendered with sufficient detail because the portions of the 3D representation 402 may not have been in the remote user's line of sight at the original angle. In any case, at block 1004, if the head mounted device 106 determines that additional 3D video is not needed to modify the 3D representation 402 or the 3D visualization 118, the head mounted device 106 may modify the visualization based on the current 3D video available and the particular gesture or command.

At block 1006, if the head mounted device 106 determines that additional 3D video is needed to modify the 3D representation 402 or the 3D visualization 118 in the visualization 114, the head mounted device 106 may perform the actions described with regard to blocks 906 and 908 in FIG. 9. For example, the head mounted device 106 may request 3D video associated with the real-world, industrial system 119 or one or more real-world, industrial automation devices that is needed to modify the visualization 114 based on the detected gesture or voice command. The computing system 110 may request image data associated with the real-world, industrial system 119 or the real-world, industrial automation devices based on the request from the head mounted device 106. In some embodiments, the imaging system 116 may determine a desired position and/or orientation associated with each mobile camera utilized by the imaging system 116 to acquire image data of the industrial system 119 based on the request. After determining the desired positions and/or orientations of each mobile camera in the industrial system 119, the imaging system 116 may send a signal to each mobile camera to move to the desired position and/or orientation to acquire image data of the industrial system 119. The imaging system 116 may then receive the image data from the mobile cameras and transmit the image data to the computing system 110. The computing system 110 may then generate 3D video as described herein.

At block 1008, after receiving the 3D video from the computing system 110, the head mounted device 106 may process the received 3D video and modify the 3D representation 402 or the 3D visualization 118 in the visualization 114 based on the additional 3D video and the detected gesture or voice command. In this way, the computing system 110 and the head mounted device 106 may modify the visualization 114 to include real-time or near-real-time data associated with the industrial system 119 or one or more industrial automation devices as needed. As such, a processing load associated with the computing system 110 and the head mounted device 106 may be reduced. In some embodiments, blocks 1002 to 1010 may be continuously repeated by the computing system 110 and the head mounted device 106 as the head mounted device 106 detects additional gesture or voice commands performed by the remote user 104. Thus, the components of the volumetric 3D imaging system 100 may continuously modify the 3D representation 402 of the industrial system 119 or the 3D visualization 118 in real-time or substantially real-time as respective regions of the 3D visualization 402 or the 3D visualization 118 become of interest to the remote user 104.

In some embodiments, it may be beneficial for the remote user 104 to instruct personnel within the real-world, industrial system 119 to perform certain actions with respect to the real-world, industrial system 119 or one or more real-world industrial automation devices. For example, the remote user 104 may determine that a maintenance issue with an industrial automation device may be resolved by personnel located within or near the industrial system 119. With the foregoing in mind, FIG. 11 illustrates a perspective view of a remote user 104 utilizing a first head mounted device 106 from a location 107 different from the industrial system 119 to communicate with a local user 1104 utilizing a second head mounted device 1106 at the location of the industrial system 119. In the illustrated embodiment, the remote user 104 may view and interact with a 3D device visualization 1114 in the visualization 1112 that corresponds to the real-world, industrial automation device 1110 in the industrial system 119. The local user 1104 may view a virtual representation 1108 of the remote user 104 (e.g., virtual remote user 1108) in the visualization 1102 displayed to the local user 1104 via the second head mounted device 1106. In some embodiments, the remote user 104 via the virtual remote user 104 may present various educational instructions, maintenance instructions, operational instructions, or the like, associated with the real-world, industrial automation device 1110.

Technical effects of the present disclosure include techniques for facilitating the visualization and monitoring of an industrial system by a user in a volumetric 3D imaging environment. The volumetric 3D imaging system may allow a user to monitor and resolve maintenance issues with real-world industrial systems and/or real-world industrial automation devices remotely. Additionally, the volumetric 3D imaging system may provide real-time or near-real-time data associated with the industrial system and/or the industrial automation devices to a remote user by providing 3D visualizations of such real world objects using 3D video. In this way, the remote user may monitor or inspect the industrial system without having the physically visit the industrial system.

While only certain features of the disclosure have been illustrated and described herein, many modifications and changes will occur to those skilled in the art. It is, therefore, to be understood that the appended claims are intended to cover all such modifications and changes as fall within the true spirit of the disclosure.

What is claimed is:

1. A system for monitoring an industrial system, comprising:
    a computing device, configured to:
        generate a first three-dimensional (3D) visualization based on volumetric video associated with an industrial system, wherein the first 3D visualization comprises one or more 3D device visualizations configured to depict a 3D object that corresponds to a respective industrial automation device in the industrial system, wherein each surface of the one or more 3D device visualizations is generated based on the volumetric video and one or more computer-aided-design (CAD) drawings associated with the respective industrial automation device that corresponds to the one or more 3D device visualizations;
        display the first 3D visualization via an electronic display;
        detect a user input associated with the electronic display, wherein the user input is indicative of a modification associated with the first 3D visualization, and wherein a user that provided the user input is remotely located with respect to the industrial system;
        determine a desired position, or a desired orientation, or both, of one or more cameras in the industrial system to acquire a first set of image data associated with the industrial system based on the detected user input;
        send a command to the one or more cameras in the industrial system to position the one or more cameras at the desired position, or the desired orientation, or both, to acquire the first set of image data;
        receive additional volumetric video generated based on the first set of image data from the one or more cameras;
        generate a second 3D visualization based on the modification and the additional volumetric video; and
        display the second 3D visualization via the electronic display.

2. The system of claim 1, wherein the one or more cameras comprise one or more drone devices, or one or more image acquisition devices mounted to a moveable track, or both.

3. The system of claim 1, wherein the computing device is configured to receive operational data from one or more sensors associated with the respective industrial automation device in response to detecting the user input and generate the second 3D visualization based on the modification, the additional volumetric video, and the operational data.

4. The system of claim 3, wherein the computing device is configured to display the operational data as a virtual overlay proximate to the 3D object in the second 3D visualization.

5. The system of claim 1, wherein the computing device is configured to receive audio data associated with the respective industrial automation device from one or more sensors in the industrial system in response to detecting the user input.

6. The system of claim 5, wherein the computing device is configured to output the received audio data in sync with the second 3D visualization.

7. The system of claim 1, wherein the computing device is configured to generate the second 3D visualization based on the modification and the additional volumetric video in near real-time.

8. The system of claim 1, wherein the first set of image data comprises a second set of image data associated with one or more industrial automation devices in the industrial system, and wherein the computing device is configured to:
identify one or more sensors associated with the one or more industrial automation devices based on the second set of image data.

9. The system of claim 8, wherein the computing device is configured to receive maintenance data of the one or more industrial automation devices from the one or more sensors in the industrial system; and
wherein generating the second 3D visualization comprises generating the second 3D visualization based on the modification, the maintenance data of the one or more industrial automation devices, and the additional 3D video.

10. A method, comprising:
receiving, via one or more processors, volumetric video associated with an industrial system;
generating, via the one or more processors, a first three dimensional (3D) visualization based on the volumetric video, wherein the first 3D visualization comprises one or more 3D device visualizations, configured to depict a 3D object that corresponds to a respective physical industrial automation device in the industrial system;
displaying, via the one or more processors, the first 3D visualization via an electronic display;
detecting, via the one or more processors, a user input associated with the electronic display, wherein the user input is indicative of a modification associated with the first 3D visualization, and wherein a user that provided the user input is remotely located with respect to the industrial system;
determining, via the one or more processors, a desired position, or a desired orientation, or both, of one or more cameras in the industrial system to acquire a first set of image data associated with the industrial system based on the detected user input;
sending, via the one or more processors, a command to the one or more cameras in the industrial system to position the one or more cameras at the desired position, or the desired orientation, or both, to acquire the first set of image data;
receiving, via the one or more processors, additional 3D volumetric video generated based on the first set of image data from the one or more cameras;
generating, via the one or more processors, a second 3D visualization based on the modification and the additional volumetric video; and
displaying, via the one or more processors, the second 3D visualization via the electronic display.

11. The method of claim 10, comprising detecting, via the one or more processors, an additional user input, wherein the additional user input is indicative of a selection of the industrial system from a plurality of industrial systems.

12. The method of claim 11, comprising generating, via the one or more processors, an additional command to position the one or more cameras at an additional desired position, or an additional desired orientation, or both, to acquire an initial set of image data associated with the industrial system in response to detecting the additional user input.

13. The method of claim 12, wherein the volumetric video is generated based on the initial set of image data.

14. The method of claim 10, comprising receiving a computer-assisted-design (CAD) drawing associated with a first 3D device visualization of the one or more 3D device visualizations and generate the first 3D device visualization based on the first 3D device visualization and the CAD drawing, and wherein the first 3D visualization comprises the first 3D device visualization.

15. The method of claim 10, wherein the volumetric video comprises a 3D point cloud of image data associated with at least a portion of the industrial system and one or more industrial automation devices in the portion of the industrial system; and
wherein generating the first 3D visualization based on the volumetric video comprises generating one or more virtual surfaces of the one or more 3D device visualizations that correspond to the one or more industrial automation devices in the portion of the industrial system based on the 3D point cloud and respective computer-aided-design (CAD) drawings associated with the one or more industrial automation devices.

* * * * *